US012219271B2

(12) United States Patent
Park et al.

(10) Patent No.: US 12,219,271 B2
(45) Date of Patent: Feb. 4, 2025

(54) IMAGE SENSOR, APPLICATION PROCESSOR AND IMAGE SENSING DEVICE

(71) Applicant: SAMSUNG ELECTRONICS CO., LTD., Suwon-si (KR)

(72) Inventors: Dong-Jin Park, Suwon-si (KR); Woo Seok Choi, Suwon-si (KR); Jee Hong Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/050,270

(22) Filed: Oct. 27, 2022

(65) Prior Publication Data

US 2023/0143333 A1 May 11, 2023

(30) Foreign Application Priority Data

| Nov. 8, 2021 | (KR) | 10-2021-0152340 |
| Jan. 12, 2022 | (KR) | 10-2022-0004583 |
| Jul. 22, 2022 | (KR) | 10-2022-0090833 |

(51) Int. Cl.
*H04N 25/704* (2023.01)
*G06T 3/4015* (2024.01)
*H04N 25/11* (2023.01)
*H01L 27/146* (2006.01)

(52) U.S. Cl.
CPC .......... *H04N 25/11* (2023.01); *G06T 3/4015* (2013.01); *H04N 25/704* (2023.01); *H01L 27/14627* (2013.01)

(58) Field of Classification Search
None
See application file for complete search history.

(56) References Cited

U.S. PATENT DOCUMENTS

| 9,420,164 | B1 | 8/2016 | Galor Gluskin et al. | |
| 10,412,349 | B2 | 9/2019 | Hwang et al. | |
| 2012/0133794 | A1* | 5/2012 | Silsby | H04N 25/63 |
| | | | | 348/E5.024 |
| 2017/0099449 | A1* | 4/2017 | Kang | H04N 25/75 |
| 2017/0366770 | A1* | 12/2017 | Yokogawa | G02B 7/38 |
| 2020/0135783 | A1 | 4/2020 | Lee et al. | |
| 2020/0280659 | A1* | 9/2020 | Galor Gluskin | H04N 23/55 |
| 2020/0314362 | A1* | 10/2020 | Roh | H04N 25/585 |
| 2020/0396388 | A1 | 12/2020 | Kim et al. | |

(Continued)

*Primary Examiner* — Twyler L Haskins
*Assistant Examiner* — Wesley J Chiu
(74) *Attorney, Agent, or Firm* — F. Chau & Associates, LLC

(57) ABSTRACT

An image sensor includes a pixel array including a plurality of normal pixels, a plurality of phase detection groups, and a color filter array. Each phase detection group includes a first phase detection pixel and a second phase detection pixel disposed adjacent to the first phase detection pixel. The color filter array includes a plurality of unit groups. Each unit group includes a plurality of color filters of a same color arranged in an M×N matrix on the pixel array, wherein M and N are natural numbers. A first color filter among the color filters of a first color is disposed on the first phase detection pixel of one of the unit groups and a second color filter among the color filters of a second color different from the first color is disposed on the second phase detection pixel of another one of the unit groups.

11 Claims, 19 Drawing Sheets

(56) References Cited

U.S. PATENT DOCUMENTS

| | | | |
|---|---|---|---|
| 2022/0102413 A1* | 3/2022 | Cho | H01L 27/14621 |
| 2022/0132079 A1* | 4/2022 | Choi | H04N 25/135 |
| 2023/0122283 A1* | 4/2023 | Kim | H01L 27/14623 |
| | | | 348/302 |
| 2024/0205560 A1* | 6/2024 | Shin | H04N 23/672 |

* cited by examiner

IMAGE SENSOR, APPLICATION PROCESSOR AND IMAGE SENSING DEVICE

CROSS-REFERENCE TO RELATED APPLICATION

This U.S. non-provisional patent application claims priority under 35 U.S.C. 119 to Korean Patent Application No. 10-2021-0152340 filed on Nov. 8, 2021, No. 10-2022-0004583 filed on Jan. 12, 2022 and No. 10-2022-0090833 filed on Jul. 22, 2022 in the Korean Intellectual Property Office, and the disclosure of which are incorporated by reference in their entireties herein.

1. TECHNICAL FIELD

The present disclosure relates to an image sensor, an application processor and an image sensing device.

2. DISCUSSION OF RELATED ART

An image sensor is a semiconductor device that converts optical information into an electrical signal. The image sensor may include a charge coupled device (CCD) image sensor or a complementary metal-oxide semiconductor (CMOS) image sensor.

A pixel array constituting a CMOS image sensor includes a photoelectric conversion element for each pixel. The photoelectric conversion device may generate an electrical signal that varies according to the amount of incident light, and the CMOS image sensor may process the electrical signal to synthesize an image. Recently, with an increase in demand for high-resolution images, pixels constituting the CMOS image sensor have been required to become smaller. However, as the size of each pixel becomes smaller, it becomes difficult to manufacture a color filter of the CMOS image sensor.

SUMMARY

At least one embodiment of the present disclosure provides an image sensor including a color filter array having a plurality of unit groups including color filters of the same color arranged in an M×N matrix, where M and N are natural numbers.

At least one embodiment of the present disclosure provides an application processor for processing data provided from an image sensor including a color filter array having a plurality of unit groups including color filters of the same color arranged in an M×N matrix, where M and N are natural numbers.

At least one embodiment of the present disclosure provides an image sensing device including an image sensor including a color filter array having a plurality of unit groups including color filters of the same color arranged in an M×N matrix, where M and N are natural numbers.

According to an embodiment, an image sensor includes a pixel array and a color filter array. The pixel array includes a plurality of normal pixels, and a plurality of phase detection groups. Each phase detection group includes a first phase detection pixel and a second phase detection pixel disposed adjacent to the first phase detection pixel. The color filter array includes a plurality of unit groups. Each unit group includes a plurality of color filters of a same color arranged in an M×N matrix on the pixel array. A first color filter among the color filters of a first color is disposed on the first phase detection pixel of one of the unit groups and a second color filter among the color filters of a second color different from the first color is disposed on the second phase detection pixel of another one of the unit groups, where M and N are natural numbers.

According to an embodiment, an image sensor includes a pixel array and an image signal processor. The pixel array includes a plurality of normal pixels and a plurality of phase detection pixel groups. Each phase detection pixel group includes a first phase detection pixel and a second phase detection pixel disposed adjacent to the first phase detection pixel. The image signal processor is configured to output one of a plurality of phase detection data generated from the phase detection pixel group and one of a plurality of image data generated from the plurality of normal pixels together via a channel.

According to an embodiment, an application processor, is configured to: receive a first phase detection signal generated from a first phase detection pixel where a first color filter is disposed, and first image data generated from a first normal pixel where the first color filter is disposed together, via a first channel from an image sensor; receive a second phase detection signal generated from a second phase detection pixel where a second color filter is disposed, and second image data generated from a second normal pixel where the second color filter is disposed together, via the first channel from the image sensor; and calculate an overall disparity between the first phase detection signal and the second phase detection signal based on the first phase detection signal, the first image data, the second phase detection signal and the second image data.

According to an embodiment, an image sensing device includes a pixel array, an image sensor, and an application processor. The pixel array includes a plurality of normal pixels configured to generate first image data and second image data, and a plurality of phase detection groups. Each phase detection group includes a first phase detection pixel configured to generate first phase detection data and a second phase detection pixel disposed adjacent to the first phase detection pixel and configured to generate second phase detection data. The image sensor includes a color filter array including a plurality of unit groups. Each unit group includes a plurality of color filters of a same color arranged in an M×N matrix on the pixel array, where M and N are natural numbers The application processor is configured to receive the first image data via a first channel and receive the second image data, the first phase detection data and the second phase detection data via a second channel, and calculate an overall disparity between the first phase detection data and the second phase detection data based on the second image data, the first phase detection data and the second phase detection data.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the attached drawings.

Figure 1:
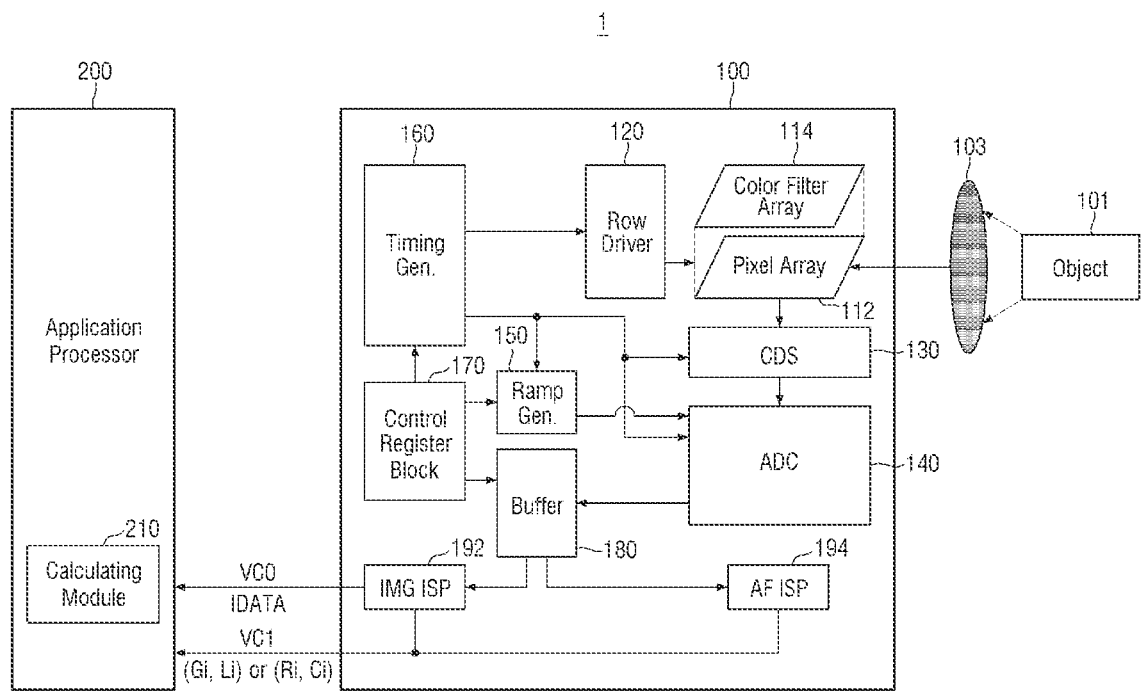
FIG. 1 is a block diagram illustrating an image system according to an embodiment.

FIG. 1 is a block diagram illustrating an image system according to an embodiment.

Referring to FIG. 1, an image sensing device 1 according to an embodiment includes an image sensor 100 and an application processor AP 200. The image sensing device 1 may be implemented as a portable electronic device such as a digital camera, a camcorder, a mobile phone, a smart phone, a tablet personal computer (PC), a personal digital assistant (PDA), a mobile Internet device (MID), a wearable computer, an Internet of things (IoT) device, or an Internet of everything (IoE) device.

The image sensor 100 may sense an object 101 photographed via a lens 103 under the control of an application processor 200. The image sensor 100 may convert an optical signal of the object 101 incident via the lens 103 into an electrical signal using a photo-sensing element (or a photoelectric conversion element), and generate and output image data based on the electrical signal.

The image sensor 100 may include a pixel array 112, a row driver 120 (e.g., a driver circuit), a correlated double sampling (CDS) block 130 (e.g., a logic circuit), an analog-to-digital converter (ADC) block 140, a ramp signal generator 150, a timing generator 160, a control register block 170, a buffer 180, a first image signal processor 192, and a second image signal processor 194.

The pixel array 112 may include a plurality of pixels arranged in a matrix form. Each of the plurality of pixels may sense light using a light sensing element (or device) and convert the sensed light into a pixel signal that is an electrical signal. Thus, the pixel array 112 may include a plurality of light sensing elements. For example, the light sensing element may be a photo diode, a photo transistor, a photo gate, a pinned photo diode (PPD), or a combination thereof. Each of the plurality of light sensing elements may have a 4-transistor structure including a photodiode, a transmission transistor, a reset transistor, an amplification transistor and a selection transistor. According to an embodiment, each of the plurality of light sensing elements may have a 1-transistor structure, a 3-transistor structure, a 5-transistor structure, or a structure in which a plurality of pixels share some transistors.

A color filter array 114 may be disposed on the pixel array 112. The pixel array 112 and the color filter array 114 will be described in detail with reference to FIG. 2.

The row driver 120 may activate each of the plurality of pixels under the control of the timing generator 160. For example, the row driver 120 may drive pixels implemented in the pixel array 112 in units of rows. For example, the row driver 120 may generate control signals capable of controlling the operation of the plurality of pixels included in each of a plurality of rows.

According to the control signals, pixel signals output from each of the plurality of pixels are transmitted to the CDS block 130.

The CDS block 130 may include a plurality of CDS circuits. Each of the plurality of CDS circuits may perform correlated double sampling on pixel values output from each of the plurality of column lines implemented in the pixel array 112 in response to at least one switch signal output from the timing generator 160, and compare the correlated double sampled pixel values with ramp signals output from the ramp signal generator 150 to output a plurality of comparison signals.

The ADC block 140 may convert each of a plurality of the comparison signals output from the CDS block 130 into digital signals and output the plurality of digital signals to the buffer 180.

The timing generator 160 may generate a signal that is a reference of operation timing of various components of the image sensor 100. An operation timing reference signal generated by the timing generator 160 may be transmitted to the row driver 120, the CDS block 130, the ADC block 140, and the ramp signal generator 150.

The control register block 170 may control an entire operation of the image sensor 100. The control register block 170 may control operations of the ramp signal generator 150, the timing generator 160 and the buffer 180.

The buffer 180 may output image row data and phase row data corresponding to the plurality of digital signals output from the ADC block 140. The image row data may be generated from a normal pixel, and the phase row data may be generated from a phase detection pixel.

Each of the first image signal processor 192 and the second image signal processor 194 may output image data IDATA Gi and Ci and phase detection data Li and Ri by performing image processing on each of the image row data and the phase row data. For example, each of the first image signal processor 192 and the second image signal processor 194 may perform image processing to change a data format for each image data and each phase detection data (e.g., changing image data in a Bayer pattern to a YUV or RGB format), and image processing to improve image quality such as noise removal, brightness adjustment and sharpness adjustment.

The first image signal processor 192 and the second image signal processor 194 may be implemented with hardware of the image sensor 100. Alternatively, the first image signal processor 192 and the second image signal processor 194 may be disposed outside the image sensor 100 or inside the application processor 200.

The application processor 200 may receive the image data IDATA Gi and Ci and the phase detection data Li and Ri from the image sensor 100 via an interface. In an embodiment, the application processor 200 receives first image data IDATA from the image sensor 100 via a first channel VC0. The application processor 200 may receive the phase detection data Li and Ri and second image data Gi and Ci together from the image sensor 100 via a second channel VC1. In other words, the application processor 200 may receive a pair of phase detection data Li and Ri and second image data Gi and Ci via the second channel VC1. Hereinafter, it will be described in detail with reference to FIG. 3.

The application processor 200 may perform post-processing on the image data IDATA Gi and Ci and the phase detection data Li and Ri. The post-processing may refer to an application of an image enhancement algorithm to remove artifacts. For example, the application processor 200 may perform an image post-processing operation of adjusting image parameters such as brightness, contrast, gamma, and luminance with respect to the image data IDATA Gi and Ci generated from a normal pixel NPX (see FIG. 2) as will be described below. For example, the image post-processing operation may include a variety of operations for improving image quality, such as a noise reduction operation, gamma correction, color filter array interpolation, a color matrix, color correction and color enhancement. Then, the application processor 200 may generate an image file by performing a compression operation and may restore the image data from the image file.

In an embodiment, the application processor 200 includes a calculating module 210. The calculating module 210 may calculate a disparity (i.e., a phase difference) with respect to the phase detection data Li and Ri generated from phase detection pixels PD1 and PD2 as will be described below. The calculating module 210 may be implemented with, for example, software or firmware executed on the application processor 200. Alternatively, the calculating module 210 may be implemented with hardware.

Based on the disparity calculation result, the application processor 200 may obtain a location of a focus, a direction of a focus, or a distance between the object 101 and the image sensor 100. The application processor 200 may output the control signal to a lens driver to move a location or angle of a lens 103 based on the disparity calculation result.

The application processor 200 may be a central processing unit (CPU), a microprocessor or a microcontroller unit (MCU).

Figure 2:
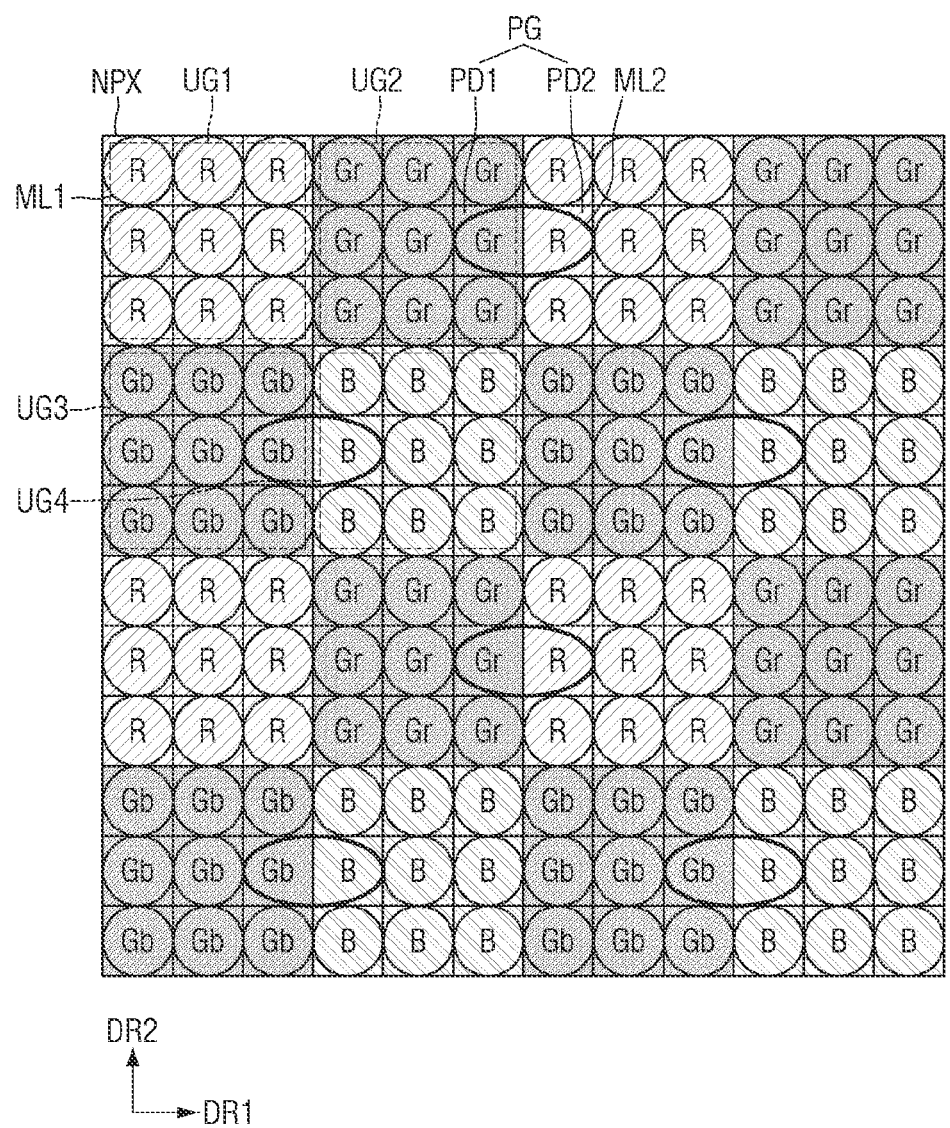
FIG. 2 is a view illustrating the pixel array and the color filter array in FIG. 1.

FIG. 2 is a view illustrating an embodiment of the pixel array (e.g., 112) and the color filter array (e.g., 114) in FIG. 1.

Referring to FIG. 2, a pixel array 112a according to an embodiment includes a plurality of normal pixels NPX and a plurality of phase detection pixel groups PG. For example, the plurality of phase detection pixel groups PG may be regularly arranged along a first direction DR1 and/or a second direction DR2.

Each of the phase detection pixel groups PG may include a plurality of phase detection pixels PD1 and PD2 disposed adjacent to each other. For example, each of the phase detection pixel groups PG may include a first phase detection pixel PD1 and a second phase detection pixel PD2 disposed adjacent to each other. The first phase detection pixel PD1 and the second phase detection pixel PD2 may be disposed adjacent to each other, for example, in the first direction DR1. However, the present disclosure is not limited thereto, and the first phase detection pixel PD1 and the second phase detection pixel PD2 may be disposed adjacent to each other in the second direction DR2. Alternatively, the first phase detection pixel and the second phase detection pixel included in a first phase detection pixel group PG may be disposed adjacent to each other in the first direction DR1, and the first phase detection pixel PD1 and the second phase detection pixel PD2 included in a second phase detection pixel group may be disposed adjacent to each other in the second direction DR2.

A color filter array 114a may be disposed on the pixel array 112a. For example, the color filter array 114a may overlap the pixel array 112a in a plan view. The color filter array 114a may include a plurality of unit groups UG1, UG2, UG3 and UG4. In an embodiment, each of the unit groups UG1, UG2, UG3 and UG4 include color filters of the same color arranged in an M×N matrix, where M and N are natural numbers. For example, each of the unit groups UG1, UG2, UG3 and UG4 may include color filters of a same color arranged in a 3×3 matrix. For example, each of the unit groups UG1, UG2, UG3 and UG4 may include unit color filters of a same color arranged into several rows and columns. Each of the color filters may be disposed to correspond to the normal pixel NPX, the first phase detection pixel PD1 and the second phase detection pixel PD2, respectively. For example, each of the unit groups may be disposed on pixels arranged in a 3×3 matrix among the pixels including the normal pixel NPX, the first phase detection pixel PD1 and the second phase detection pixel PD2.

The plurality of unit groups UG1, UG2, UG3 and UG4 may include, for example, a first unit group UG1 and a second unit group UG2 disposed adjacent to each other in the first direction DR1, and a third unit group UG3 and a fourth unit group UG4 disposed adjacent to each other in the first direction DR1. The first unit group UG1 and the third unit group UG3 may be disposed adjacent to each other in the second direction DR2, and the second unit group UG2 and the fourth unit group UG4 may be disposed adjacent to each other in the second direction DR2. The second direction DR2 may intersect the first direction DR1. The first unit group UG1 may include a first color filter R, the second unit group UG2 may include a second color filter Gr, the third unit group UG3 may include a third color filter Gb, and the fourth unit group UG4 may include a fourth color filter B. The first color filter R may be a red color filter, the second and third color filters Gr and Gb may be green color filters, and the fourth color filter B may be a blue color filter.

In some embodiments, different unit groups UG1, UG2, UG3 and UG4 may be disposed on the first phase detection pixel PD1 and the second phase detection pixel PD2. The color filter disposed on the first phase detection pixel PD1 and the color filter disposed on the second phase detection pixel PD2 may be color filters with different colors. For example, the color filter Gr disposed on the first phase detection pixel PD1 may be a green color filter, and the color filter R disposed on the second phase detection pixel PD2 may be a red color filter.

A plurality of first micro-lenses ML1 may be disposed on the plurality of normal pixels NPX. Each of the first micro-lenses ML1 may cover each of the normal pixels NPX. For example, the first micro-lenses ML1 may overlap the normal pixels NPX in a plan view. A plurality of second micro-lenses ML2 may be disposed on a plurality of phase detection pixel groups PG. Each of the second micro-lenses ML2 may cover each of the phase detection pixel groups PG. That is, one second micro-lens ML2 may cover the first phase detection pixel PD1 and the second phase detection pixel PD included in one phase detection pixel group PG. For example, the second micro-lenses ML2 may overlap the phase detection pixel groups PG in a plan view.

To increase the resolution of the image sensor 100, the size of the pixel has been continuously reduced. In addition, to execute a phase difference calculation using light of the same wavelength band, a color filter of the same color may be disposed on the phase detection pixels PD1 and PD2 included in the phase detection pixel group PG. Accordingly, the color filter array includes, for example, a unit group including a color filter of the same color arranged in a concave-convex shape so as to arrange the color filter of the same color on the phase detection pixel group PG. That is, the unit group of the color filter array includes a portion protruding or indented from one side thereof. Accordingly, the difficulty of the manufacturing process of the image sensor increases.

On the other hand, in the image sensor according to an embodiment of the inventive concept, since a color filter of the same color does not need to be disposed on the phase detection pixels PD1 and PD2, the color filter array 114a may include a plurality of rectangular unit groups UG1, UG2, UG3 and UG4. Accordingly, the difficulty of the manufacturing process of the image sensor may be reduced.

Figure 3:
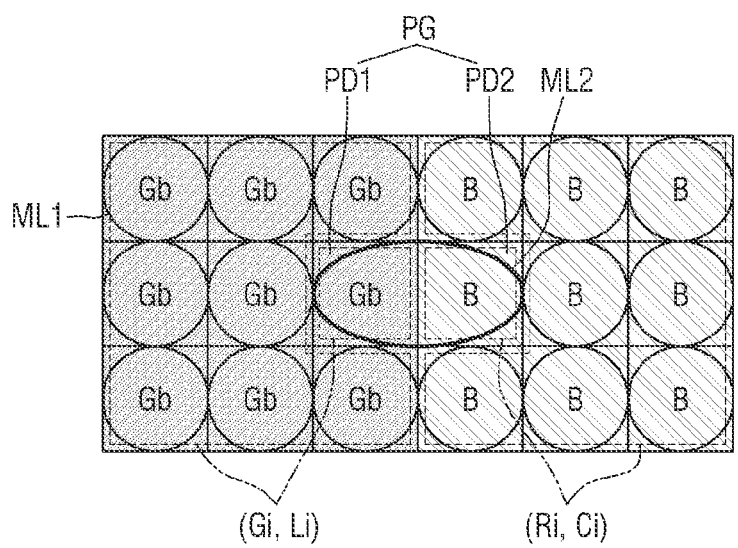
FIG. 3 is a view illustrating an operation of an image system according to an embodiment.

FIG. 3 is a view illustrating an operation of an image system according to an embodiment.

Referring to FIGS. 1 to 3, the image sensor 100 may alternately transmit the image data and the phase detection data to the application processor 200 via the first channel VC0 and the second channel VC1. The first channel VC0 may be preset to transmit the image data according to an interface standard of the image sensor 100 and the application processor 200. The second channel VC1 may be preset to transmit the phase detection data according to the interface standard of the image sensor 100 and the application processor 200. Accordingly, the application processor 200 may recognize the data provided to the first channel VC0 as data for generating an image and may recognize the data provided to the second channel VC1 as data for performing phase detection. The application processor 200 may perform the phase difference calculation based on the data provided to the second channel VC1.

In an embodiment, the first channel VC0 and the second channel VC1 refers to a virtual channel according to a mobile industry processor interface alliance (MIPI) standard.

In an embodiment, via the second channel VC1, the image sensor 100 provides phase detection data generated from a phase detection pixel, and image data generated from a normal pixel where the color filter of the same color as the color filter disposed on the phase detection pixel is disposed and which is included in the same unit group as the phase detection pixel. The color filter belonging to the same unit group may be disposed on the normal pixel and the phase detection pixel.

An example of the phase detection pixel group PG included in the third unit group UG3 and the fourth unit group UG4 will be described below.

The third unit group UG3 with the third color filter Gb may be disposed on the first phase detection pixel PD1 and a plurality of normal pixels NPX11 to NP18. The fourth unit group UG4 with the fourth color filter B may be disposed on the second phase detection pixel PD2 and a plurality of normal pixels NPX21 to NPX28. The first phase detection pixel PD1 and the second phase detection pixel PD2 may be disposed adjacent to each other. In an embodiment, the third color filter Gb disposed on the first phase detection pixel PD1 differs from the fourth color filter B disposed on the second phase detection pixel PD2. For example, a color of the third color filter Gb may be different from a color of the fourth color filter B. The image sensor 100 may output, via the second channel VC1, a pair of the image data Gi generated from a normal pixel belonging to the same unit group as the first phase detection pixel PD1 and a first phase data Li generated from the first phase detection pixel PD1, and a pair of a second phase detection data Ri generated from the second phase detection pixel PD2 and the image data Ci generated from a normal pixel belonging to the same unit group as the second phase detection pixel PD2. It will be described with reference to FIGS. 4 to 6.

Figure 4:
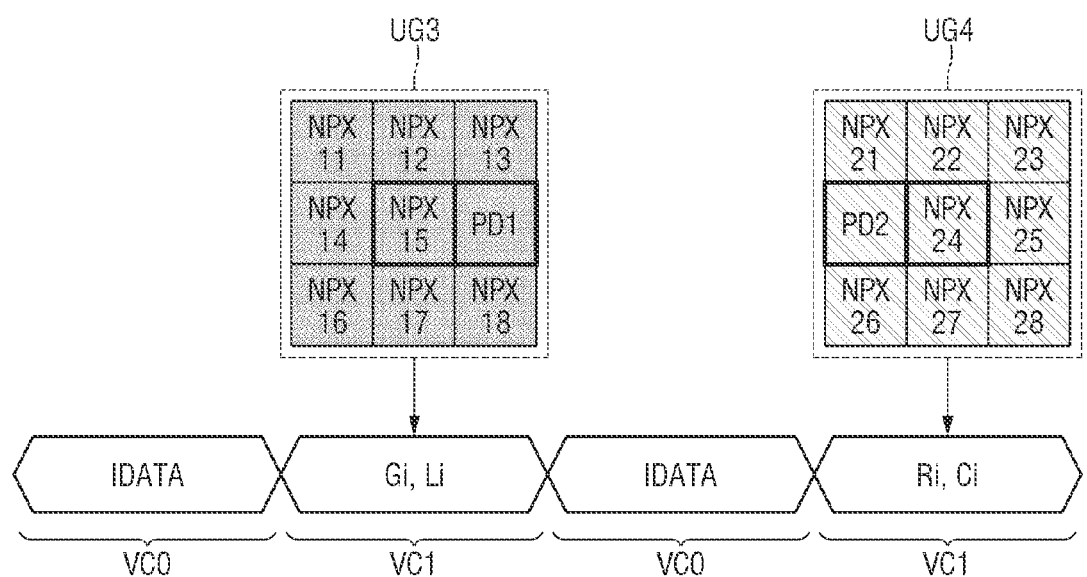
FIGS. 4 to 6 are views illustrating the operation of the image system according to an embodiment.
Figure 5:
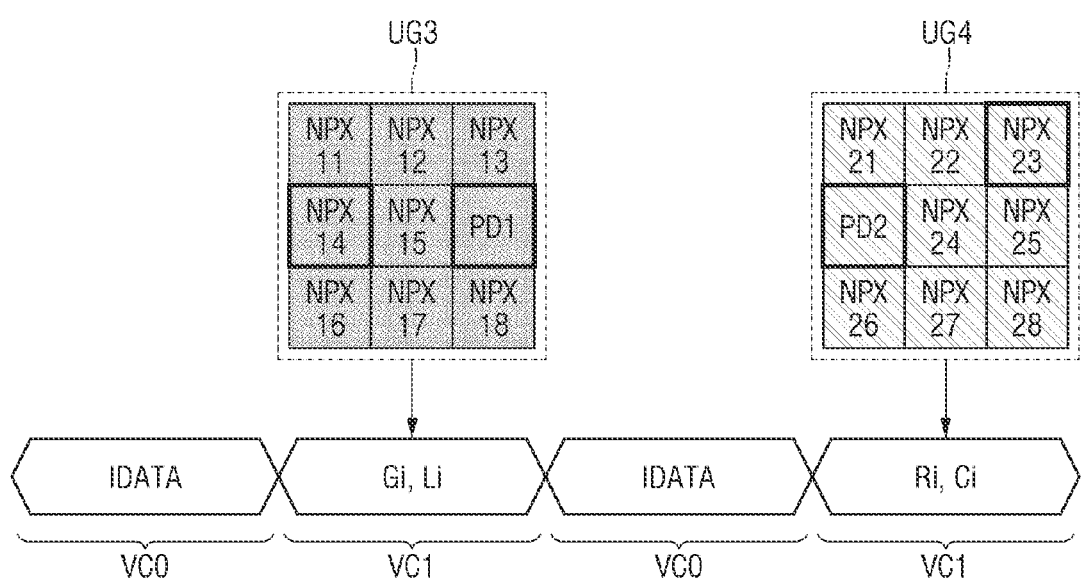
Figure 6:
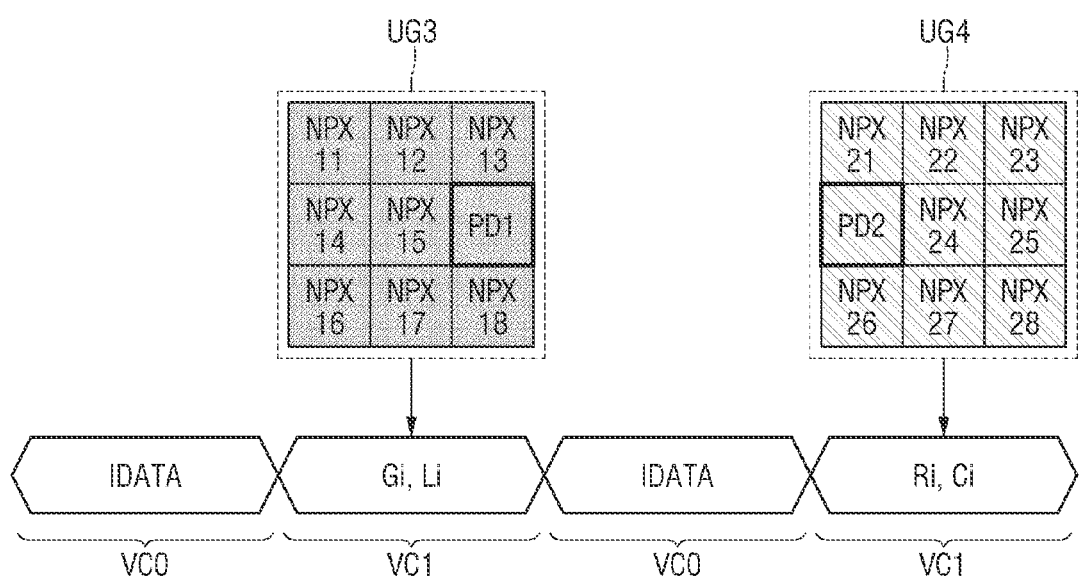

FIGS. 4 to 6 are views illustrating the operation of the image system according to an embodiment. An example of the phase detection pixel group PG included in the third unit group UG3 and the fourth unit group UG4 in FIG. 2 will be described below.

Referring to FIG. 4, in an embodiment, via the second channel VC1, the image sensor 100 provides the phase detection data Li and Ri generated from the phase detection pixel, and the image data Gi and Ci generated from the normal pixel where the color filter belonging to the same unit group as the color filter disposed on the phase detection pixel is disposed and which is disposed adjacent to the phase detection pixel. In an embodiment, the first phase detection data Li includes or indicates a first angle, the second phase detection data Ri includes or indicates a second angle, and a disparity can be determined from the first and second angles.

The image sensor 100 may output the image data Gi and the first phase detection data Li generated from the first phase detection pixel PD1 via the second channel VC1. The image data Gi may be generated from one normal pixel NPX15 among normal pixels NPX13, NPX15 and NPX18 where the color filter Gb belonging to the same unit group UG3 as the color filter Gb disposed on the first phase detection pixel PD1 is disposed and which are disposed adjacent to the first phase detection pixel PD1. The image sensor 100 may output the second phase detection data Ri generated from the second phase detection pixel PD2 and the image data Ci via the second channel VC1. The image data Ci may be generated from one normal pixel NP24 among normal pixels NPX21, NP24 and NP26 where the color filter B belonging to the same unit group UG4 as the color filter B disposed on the second phase detection pixel PD2 is disposed and which are disposed adjacent to the second phase detection pixel PD2.

The application processor 200 may calculate the disparity based on the first phase detection data Li, the image data Gi, the second phase detection data Ri and the image data Ci.

Referring to FIG. 5, in an embodiment, the image sensor 100 provides, via the second channel VC 1, the phase detection data Li and Ri generated from the phase detection pixel, and the image data Gi and Ci generated from the normal pixel where a color filter belonging to the same unit group as the color filter disposed on the phase detection pixel are disposed.

The image sensor 100 may output, via the second channel VC1, the image data Gi generated from one normal pixel NPX14 among normal pixels NPX11 to NPX18 where the color filter Gb belonging to the same unit group UG3 as the first phase detection pixel PD1 is disposed, and the first phase detection data Li generated from the first phase detection pixel PD1. The image sensor 100 may output, via the second channel VC1, the second phase detection data Ri generated from the second phase detection pixel PD2, and the image data Ci generated from one normal pixel NPX23 among normal pixels NPX21 to NPX28 where the color filter B belonging to the same unit group UG4 as the second phase detection pixel PD2 is disposed. Different from FIG. 4, a single normal pixel selected for a given unit group is not adjacent to the phase detection pixel of the given unit group.

Referring to FIG. 6, in an embodiment, the image sensor 100 provides, via the second channel VC1, the phase detection data Li and Ri generated from the phase detection pixel, and average image data Gi and Ci of the image data generated from a plurality of normal pixels where a color filter belonging to the same unit group as the color filter disposed on the phase detection pixel are disposed.

The image sensor 100 may output the average image data Gi and the first phase detection data Li generated from the first phase detection pixel PD1 via the second channel VC1. In an embodiment, the average image data Gi is an average of a plurality of image data generated from each of the plurality of normal pixels NPX11 to NPX18 where the color filter Gb belonging to the same unit group UG3 as the first phase detection pixel PD1 is disposed. The image sensor 100 may output the second phase detection data Ri generated from the second phase detection pixel PD2 and the average image data Ci via the second channel VC1. In an embodiment, the average image data Ci is an average of a plurality of image data generated from each of the plurality of normal pixels NPX21 to NPX28 where the color filter B belonging to the same unit group UG4 as the second phase detection pixel PD2 is disposed.

Figure 7:
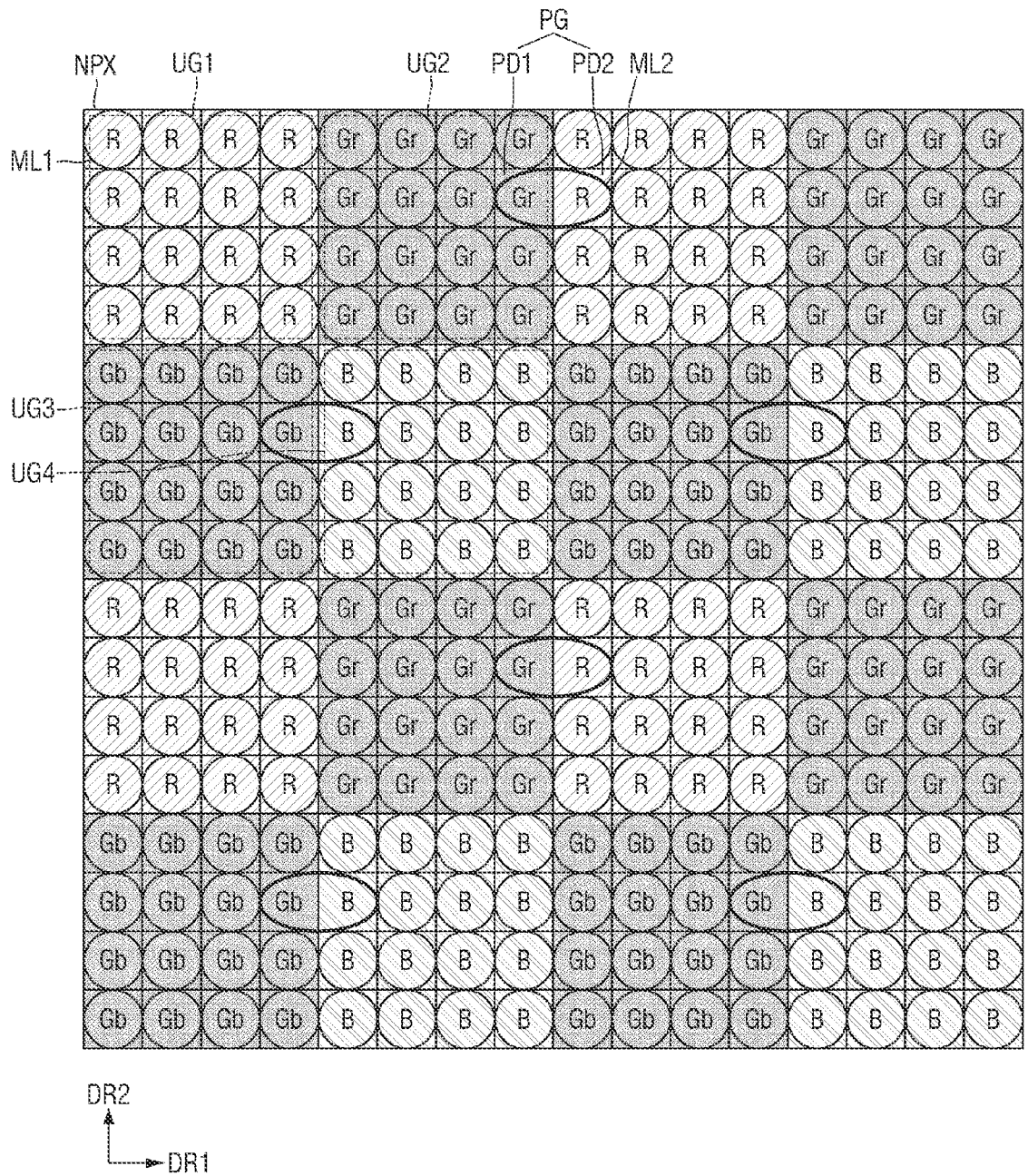
FIG. 7 is a view illustrating the pixel array and the color filter array in FIG. 1.

FIG. 7 is a view illustrating the pixel array and the color filter array in FIG. 1. For convenience of description, in which follows, the difference from the description using FIG. 2 will be mainly described.

Referring to FIG. 7, in an embodiment, a color filter array 114b is disposed on a pixel array 112b. The pixel array 112b may include a plurality of normal pixels NPX and a plurality of phase detection pixel groups PG. The pixel array 112 of FIG. 1 may be implemented by the pixel array 112b. The color filter array 114 of FIG. 1 may be implemented by the color filter array 114b.

The color filter array 114b may include the plurality of unit groups UG1, UG2, UG3 and UG4 including color filters of the same color arranged in an M×N matrix, where M and N are natural numbers. For example, each of the unit groups UG1, UG2, UG3 and UG4 may include color filters of the same color arranged in a 4×4 matrix. Each of the color filters may be disposed to correspond to the normal pixels NPX, the first phase detection pixel PD1, and the second phase detection pixel PD2, respectively. For example, each unit group may be disposed on pixels arranged in a 4×4 matrix among pixels including the normal pixel NPX, the first phase detection pixel PD1 and the second phase detection pixel PD2.

Figure 8:
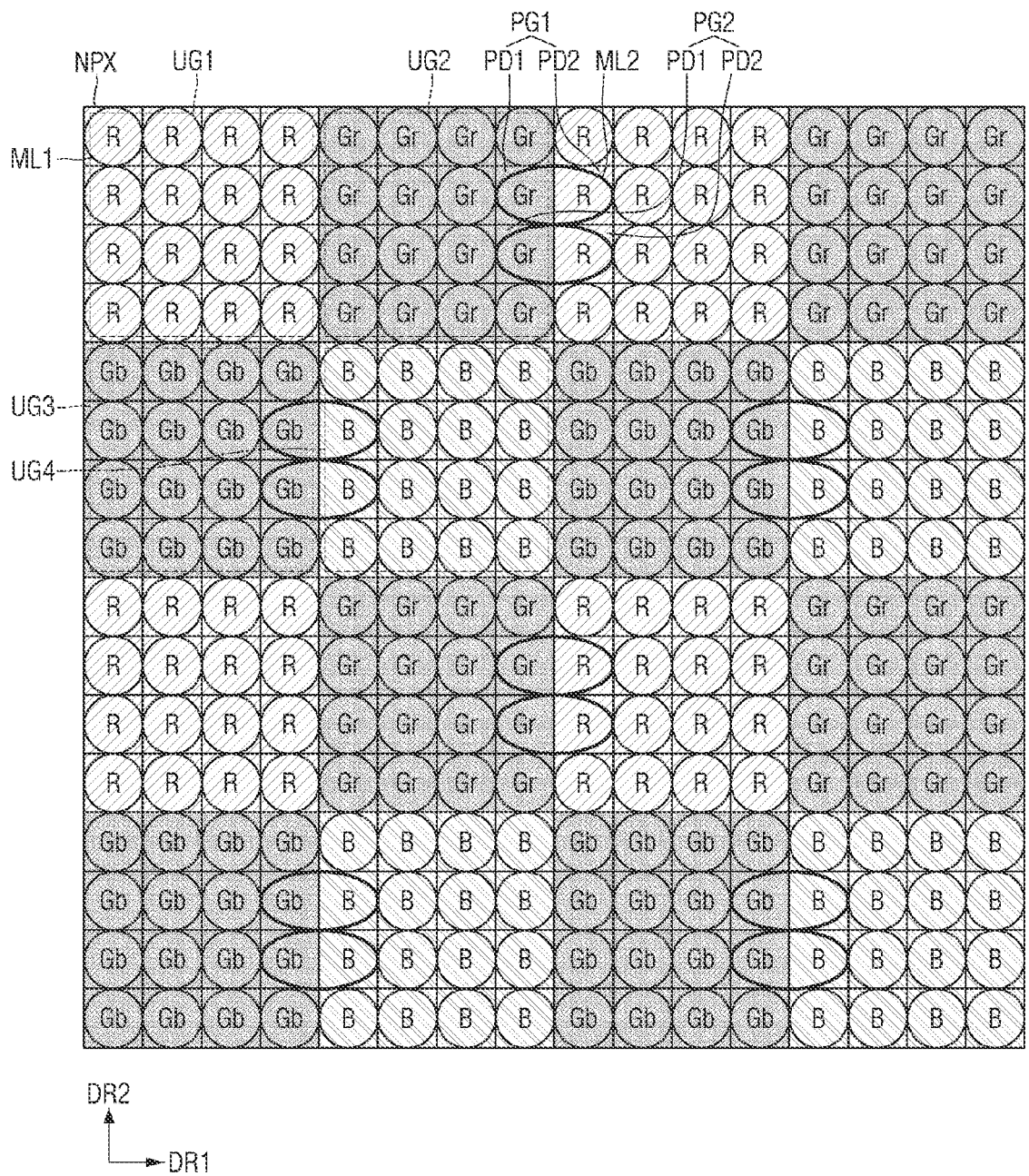
FIG. 8 is a view illustrating the pixel array and the color filter array in FIG. 1.

FIG. 8 is a view illustrating the pixel array and the color filter array in FIG. 1. For convenience of description, in which follows, the difference from that described using FIG. 7 will be mainly described.

Referring to FIG. 8, in an embodiment, the color filter array 114b is disposed on the pixel array 112c. The pixel array 112 of FIG. 1 may be implemented by the pixel array 112c. The pixel array 112c may include the plurality of normal pixels NPX, a plurality of first phase detection pixel groups PG1 and a plurality of second phase detection pixel groups PG2. For example, the plurality of first phase detection pixel groups PG1 and the plurality of second phase detection pixel groups PG2 may be regularly arranged along the first direction DR1 and/or the second direction DR2.

Each of the first phase detection pixel group PG1 and the second phase detection pixel group PG2 may include the plurality of phase detection pixels PD1 and PD2 disposed adjacent to each other. For example, each of the phase detection pixel groups PG may include the first phase detection pixel PD1 and the second phase detection pixel PD2 disposed adjacent to each other.

A first phase detection pixel group PG1 may be disposed adjacent to a second phase detection pixel group PG2. For example, the first phase detection pixel group PG1 may be disposed adjacent to the second phase detection pixel group PG2 in the second direction DR2.

In an embodiment, the different unit groups UG1, UG2, UG3 and UG4 may be disposed on the first phase detection pixel PD1 of the first phase detection pixel group PG1 and the second phase detection pixel PD2 of the first phase detection pixel group PG1. The different unit groups UG1, UG2, UG3 and UG4 may be disposed on the first phase detection pixel PD1 of the second phase detection pixel group PG2 and the second phase detection pixel PD2 of the second phase detection pixel group PG2.

Figure 9:
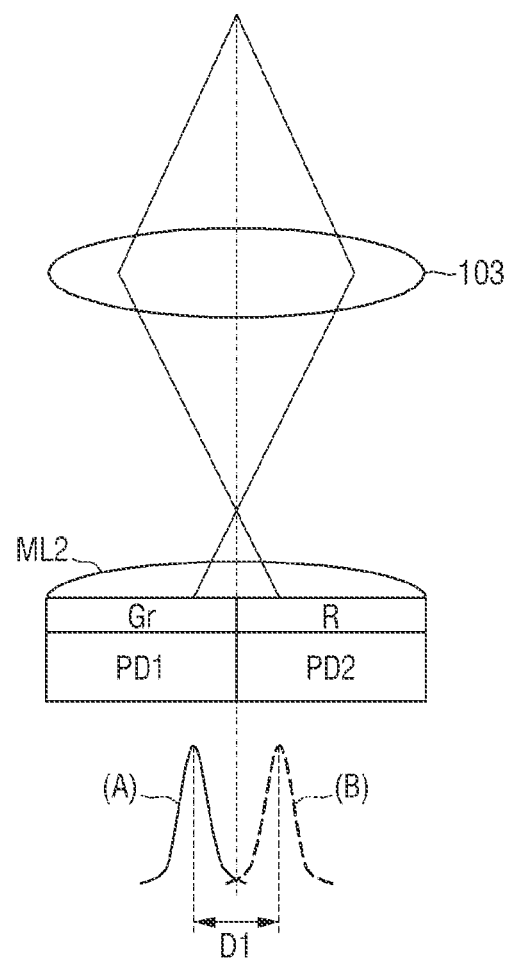
FIGS. 9 and 10 are views illustrating a method for calculating a disparity according to an embodiment.
Figure 10:
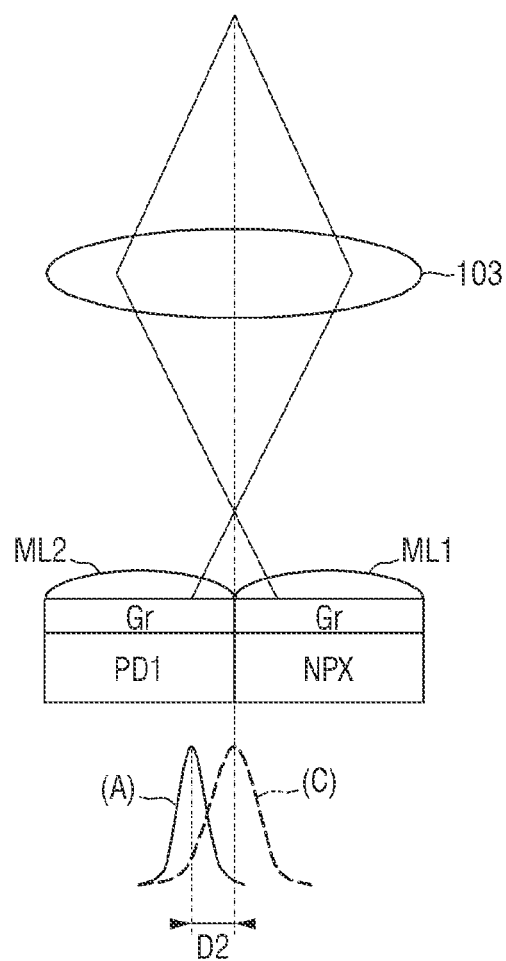

FIGS. 9 and 10 are views illustrating a method for calculating a disparity according to an embodiment.

An example of the first phase detection pixel PD1 where the color filter Gr included in the second unit group UG2 is disposed, the second phase detection pixel PD2 where the color filter R included in the first unit group UG1 is disposed, and the normal pixel NPX where the color filter Gr included in the same second unit group UG2 as the color filter Gr disposed on the first phase detection pixel PD1 is disposed is described.

Referring to FIG. 9, the image sensor may sense light reflected from the object 101 (see FIG. 1) and condensed via the lens 103. The condensed light may be incident on the first phase detection pixel PD1 and the second phase detection pixel PD2 via the second micro-lens ML2 of the image sensor. First phase detection data A may be generated from light incident to the first phase detection pixel PD1, and second phase detection data B may be generated from light incident to the second phase detection pixel PD2.

In that case, since the color filter Gr on the first phase detection pixel PD1 differs from the color filter R on the second phase detection pixel PD2, a disparity D1 between the first phase detection data A and the second phase detection data B may be generated by not only a phase difference but also a sensitivity difference between colors. Therefore, since accurate auto-focusing is difficult to perform based on the disparity D1, it may be necessary to correct the first phase detection data A and the second phase detection data B due to the difference in the color filter.

Referring to FIG. 10, the image sensor may sense the light reflected from the object 101 (see FIG. 1) and condensed via the lens 103. The condensed light may be incident on the first phase detection pixel PD1 via the second micro-lens ML2 of the image sensor and may be incident on the normal pixel NPX via the first micro-lens ML1.

The first phase detection data A may be generated from the light incident on the first phase detection pixel PD1, and image data C may be generated from the light incident on the normal pixel NPX. The color filter Gr on the first phase detection pixel PD1 is identical to the color filter Gr on the normal pixel NPX. A disparity D2 between the first phase detection data A and the image data C may be approximately twice as large as the disparity D1 in FIG. 8. Accordingly, the disparity between the first phase detection data and the second phase detection data may be calculated using the image data. It will be described in detail with reference to FIGS. 11 to 14.

Figure 11:
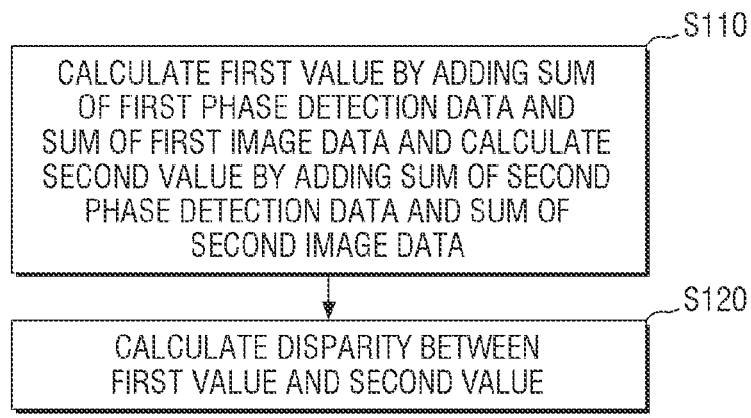
FIG. 11 is a flowchart describing a method for calculating a disparity according to an embodiment.

FIG. 11 is a flowchart describing the method for calculating the disparity according to an embodiment.

Referring to FIGS. 3 and 11, the pair of the first image data Gi and the first phase detection data Li and the pair of the second phase detection data Ri and the second image data Ci may be alternately provided via the second channel VC1. The calculating module 210 of the application processor 200 according to an embodiment may calculate the disparity Dt using Equations 1 to 3 where x means a reference location and d means a disparity, and d in which Equation 3 is minimized becomes the disparity Dt.

$$\text{PD\_left} = \sum Li + \sum Gi \qquad \text{[Equation 1]}$$

$$\text{PD\_right} = \sum Ci + \sum Ri \qquad \text{[Equation 2]}$$

$$Dt = \operatorname*{argmin}_{d}(\text{PD\_left}_x - \text{PD\_right}_{x-d}) \qquad \text{[Equation 3]}$$

Specifically, a first value PD_left may be calculated by adding the sum ($\Sigma Li$) of the first phase detection data and the sum ($\Sigma Gi$) of the first image data, while a second value PD_right may be calculated by adding the sum ($\Sigma Ci$) of the second image data and the sum ($\Sigma Ri$) of the second phase detection data (S110).

Then, the calculating module 210 may calculate the disparity Dt between the first value PD_left and the second value PD_right (S120). Accordingly, the calculating module 210 may calculate the disparity Dt based on the image data and the phase detection data. The application processor 200 may perform auto-focusing based on the calculated disparity Dt.

Alternatively, the calculating module 210 may calculate the first value PD_left of the phase detection data using Equation 4 and may calculate the second value PD_right of the phase detection data using Equation 5.

$$\text{PD\_left} = \Sigma(Li+Gi) \qquad \text{[Equation 4]}$$

$$\text{PD\_right} = \Sigma(Ci+Ri) \qquad \text{[Equation 5]}$$

Specifically, the first value PD_left may be calculated by adding the sum of the first phase detection data Li and the sum of the first image data Gi and the second value PD_right may be calculated by adding the sum of the second image data Ci and the sum of the second phase detection data Ri.

Figure 12:
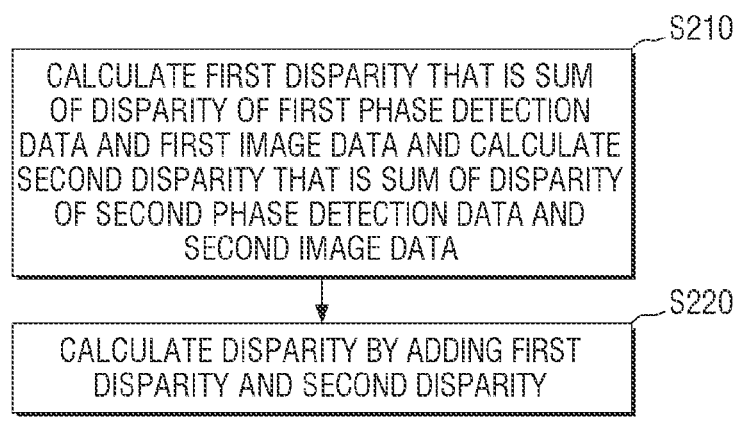
FIG. 12 is a flowchart describing the method for calculating a disparity according to an embodiment.

The first image data Gi and the second image data Ci may be generated according to one of the descriptions used with reference to FIGS. 4 to 6. FIG. 12 is a flowchart describing a method for calculating a disparity according to an embodiment.

Referring to FIGS. 3 and 12, the pair of the first image data Gi and the first phase detection data Li and the pair of the second phase detection data Ri and the second image data Ci may be alternately provided via the second channel VC1. The calculating module 210 of the application processor 200 according to an embodiment may calculate the disparity Dt using Equations 6 to 8 where x means a reference location and d means a disparity, and d in which Equation 4 is minimized becomes a first disparity Disparity$_{even}$, and d in which Equation 5 is minimized becomes a second disparity Disparity$_{odd}$.

$$\text{Disparity}_{even} = \operatorname*{argmin}_{d}\left(\left|\sum Li, x - \sum Gi, x - d\right|\right) \qquad \text{[Equation 6]}$$

$$\text{Disparity}_{odd} = \operatorname*{argmin}_{d}\left(\left|\sum Ci, x - \sum Ri, x - d\right|\right) \qquad \text{[Equation 7]}$$

$$Dt = \text{Disparity}_{even} + \text{Disparity}_{odd} \qquad \text{[Equation 8]}$$

Specifically, the first disparity Disparity$_{even}$ which is the sum of the disparities of the first phase detection data Li and the first image data Gi may be calculated, and the second disparity Disparity$_{odd}$ which is the sum of the disparities of the second image data Ci and the second phase detection data Ri may be calculated.

Then, the calculating module 210 may calculate the disparity Dt by adding the first disparity Disparity$_{even}$ and the second disparity Disparity$_{odd}$ (S220).

Figure 13:
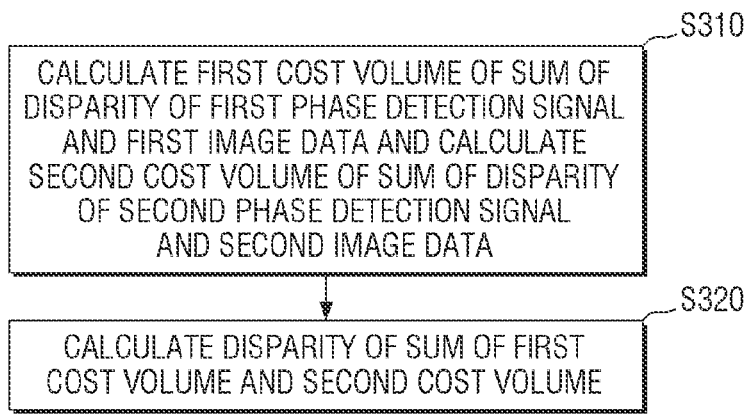
FIG. 13 is a flowchart describing the method for calculating a disparity according to an embodiment.

The first image data Gi and the second image data Ci may be generated according to one of the descriptions used with reference to FIGS. 4 to 6. FIG. 13 is a flowchart describing a method for calculating a disparity according to an embodiment.

Referring to FIGS. 3 and 13, the pair of the first image data Gi and the first phase detection data Li and the pair of the second phase detection data Ri and the second image data Ci may be alternately provided via the second channel VC1. The calculating module 210 of the application processor 200 according to an embodiments may calculate the disparity Dt using Equations 9 to 11 where x means a reference location and d means a disparity.

$$CV_{even}(d) = \qquad \text{[Equation 9]}$$
$$\left(\sum Li, x - \sum Gi, x - d\right) * \left(\sum Li, x - \sum Gi, x - d\right)$$

$$CV_{odd}(d) = \qquad \text{[Equation 10]}$$
$$\left(\sum Ci, x - \sum Ri, x - d\right) * \left(\sum Ci, x - \sum Ri, x - d\right)$$

$$\text{Disparity} = \operatorname*{argmin}_{d}(CV_{even} + CV_{odd}) \qquad \text{[Equation 11]}$$

Specifically, the first cost volume $CV_{even}(d)$ of the sum of the disparities of the first phase detection data Li and the first image data Gi and the second cost volume $CV_{odd}(d)$ of the sum of the disparities of the second image data Ci and the second phase detection data Ri may be calculated (S310).

The first image data Gi and the second image data Ci may be generated according to one of the descriptions used with reference to FIGS. 4 to 6. Then, the calculating module 210 may calculate the disparity Dt of the sum of the first cost volume $CV_{even}(d)$ and the second cost volume $CV_{odd}(d)$ (S320).

Figure 14:
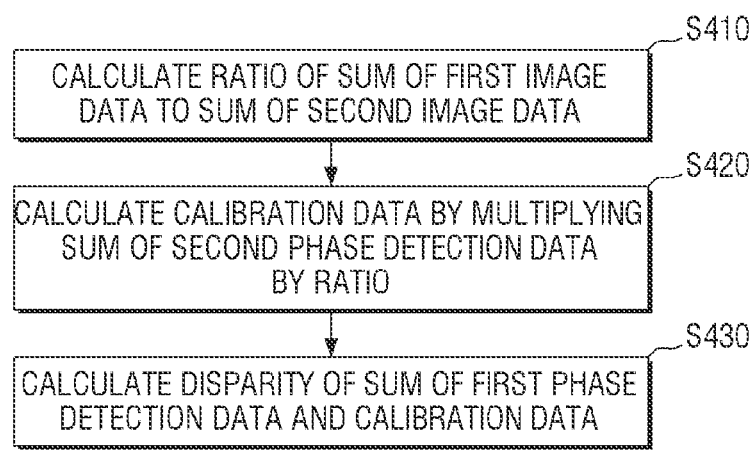
FIG. 14 is a flowchart describing the method for calculating a disparity according to an embodiments

FIG. 14 is a flowchart describing the method for calculating a disparity according to an embodiment.

Referring to FIGS. 3 and 14, the pair of the first image data Gi and the first phase detection data Li and the pair of the second phase detection data Ri and the second image data Ci may be alternately provided via the second channel VC1. The calculating module 210 of the application processor 200 according to an embodiment may calculate the disparity Dt using Equations 12 and 13.

$$Cgain = \sum Gi / \sum Ci \qquad \text{[Equation 12]}$$

$$Dt = \operatorname*{argmin}_{d}\left(\left|\overline{\sum} Li, x - Cgain * \overline{\sum} Ri, x\right|\right) \qquad \text{[Equation 13]}$$

Specifically, a ratio (Cgain) of the sum ($\Sigma Gi$) of the first image data to the sum ($\Sigma Ci$) of the second image data may be calculated (S410). That is, the second image data generated from a pixel with the second color filter may be converted into image data to be generated from a pixel with the first color filter. In that case, the first image data is generated from the pixel with the first color filter.

Then, the calculating module 210 may calculate calibration data (Cgain*ΣRi) by multiplying the sum (ΣRi) of the second phase detection data by the ratio (Cgain) calculated in S410 (S420).

Then, the calculating module 210 may calculate the disparity Dt of the calibration data (Cgain*ΣRi) calculated in S420 and the sum (ΣLi) of the first phase detection data (S430).

In an embodiment, the second image data Ci is generated from the normal pixel where the color filter is disposed instead of the green filter, while the first image data Gi is generated from the normal pixel where the green color filter is disposed. That is, the ratio may be a value in which the image data generated from the normal pixel with the color filter disposed instead of the green color filter is converted into the image data to be generated from the normal pixel where the green color filter is disposed.

Figure 15:
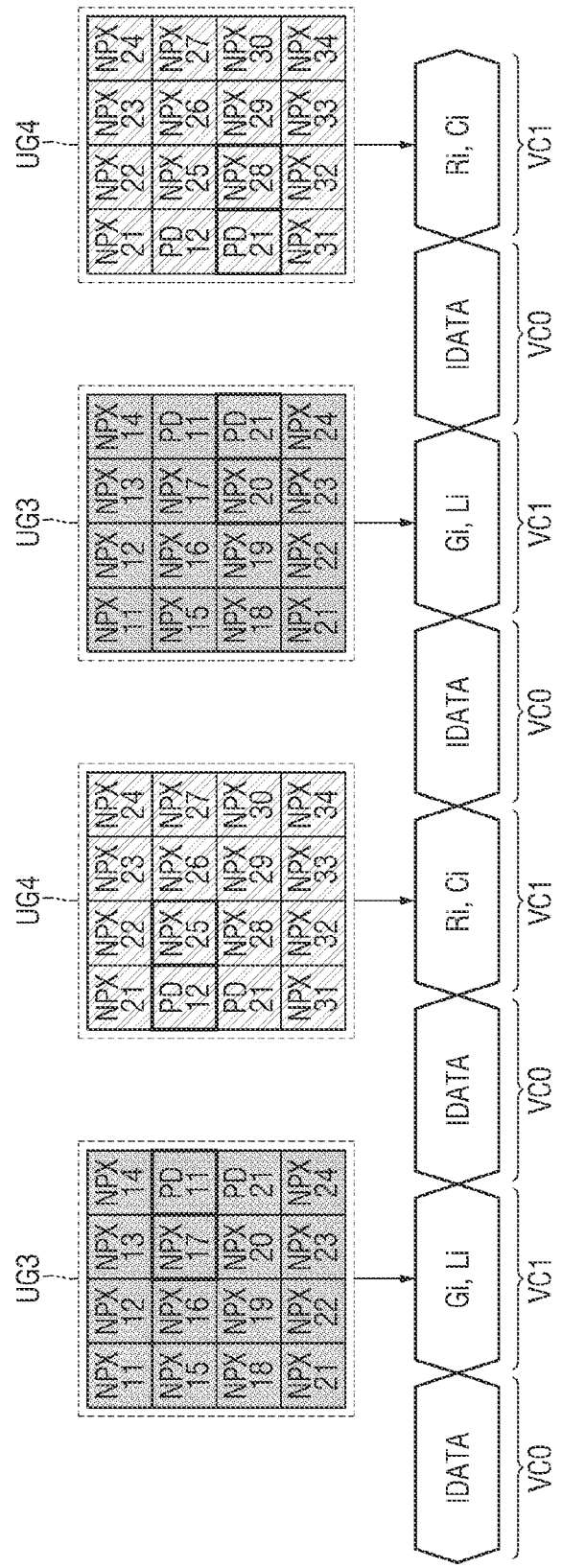
FIGS. 15 to 17 are views describing an operation of an image system according to an embodiment.
Figure 16:
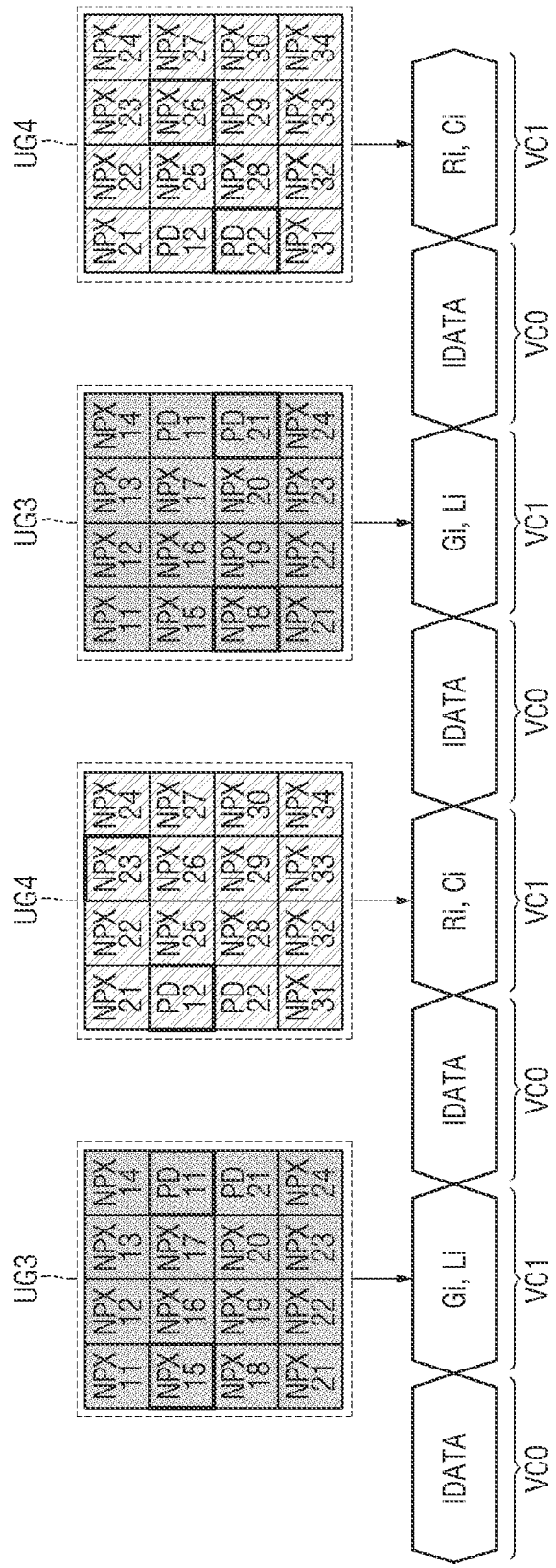
Figure 17:
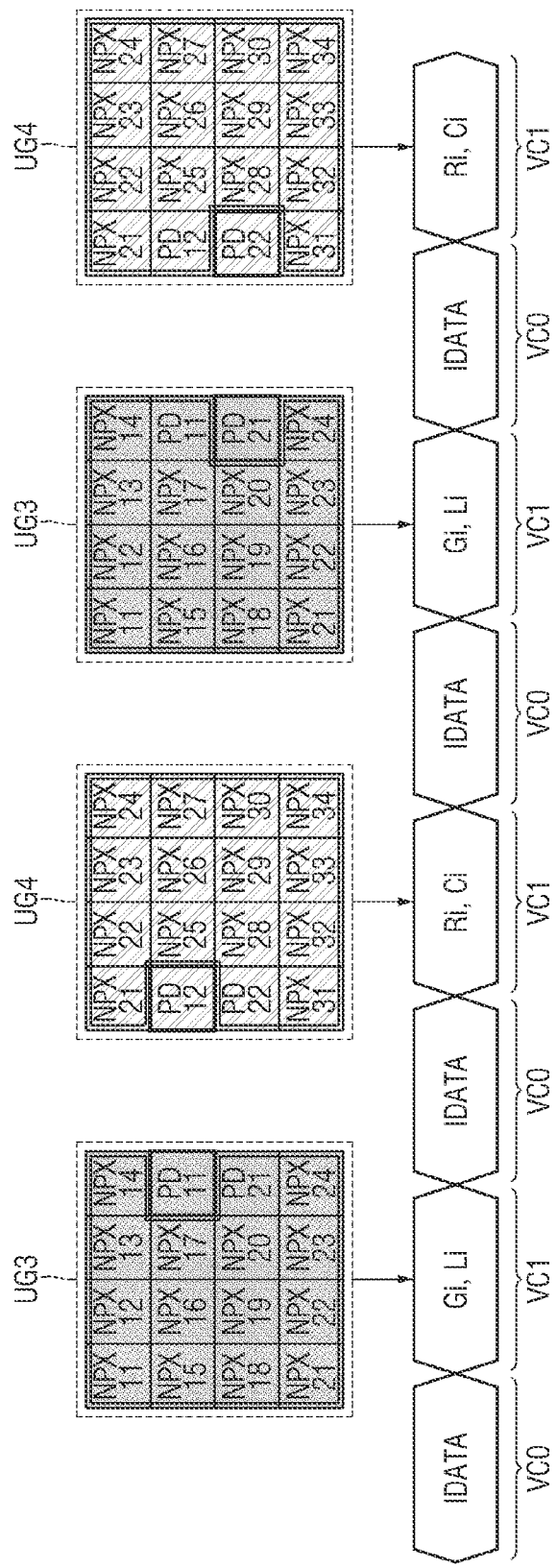

The first image data Gi and the second image data Ci may be generated according to one of the descriptions used with reference to FIGS. 4 to 6. FIGS. 15 to 17 are views describing an operation of an image system according to an embodiment. An example of the phase detection pixel group PG included in the third unit group UG3 and the fourth unit group UG4 in FIG. 8 will be described.

Referring to FIG. 15, in an embodiment, the image sensor 100 may output image data Li and first-first phase detection data Gi generated from a first-first phase detection pixel PD11 via the second channel VC1. The image data Gi may be generated from one normal NPX17 among normal pixels NPX14 and NPX17 where the color filter Gb belonging to the same unit group UG3 as the color filter Gb disposed on the first-first phase detection pixel PD11 is disposed and which are disposed adjacent to the first-first phase detection pixel PD11. The image sensor 100 may output first-second phase detection data Ri generated from a first-second phase detection pixel PD12 and the image data Ci via the second channel VC1. The image data Ci may be generated from one normal pixel NPX25 among normal pixels NPX21 and NPX25 where the color filter B belonging to the same unit group UG4 as the color filter B disposed on the first-second phase detection pixel PD12 is disposed and which are disposed adjacent to the first-second phase detection pixel PD12. The image sensor 100 may output the image data Gi and second-first phase detection data Li generated from a second-first phase detection pixel PD21 via the second channel VC1. The image data Gi may be generated from one normal pixel NPX20 among normal pixels NPX20 and NPX24 where the color filter Gb belonging to the same unit group UG3 as the color filter Gb disposed on the second-first phase detection pixel PD21 is disposed and which are disposed adjacent to the second-first phase detection pixel PD21. The image sensor 100 may output the image data Ci and second-second phase detection data Ri generated from a second-second phase detection pixel PD22 via the second channel VC1. The image data Ci may be generated from one normal pixel NPX28 among normal pixels NPX28 and NPX31 where the color filter B belonging to the same unit group UG4 as the color filter B disposed on the second-second phase detection pixel PD22 is disposed and which are disposed adjacent to the second-second phase detection pixel PD22.

Referring to FIG. 16, in an embodiment, the image sensor 100 may output the image data Gi and first-first phase detection data Li generated from the first-first phase detection pixel PD11 via the second channel VC1. The image data Gi may be generated from one normal pixel NPX15 among a plurality of normal pixels NPX11 to NPX24 where the color filter Gb belonging to the same unit group UG3 as the color filter Gb disposed on the first-first phase detection pixel PD11 is disposed. The image sensor 100 may output the first-second phase detection data Ri generated from the first-second phase detection pixel PD12 and the image data Ci via the second channel VC1. The image data Ci may be generated from one NPX23 among a plurality of normal pixels NPX21 to NPX34 where the color filter B belonging to the same unit group UG4 as the color filter B disposed on the first-second phase detection pixel PD12 is disposed. The image sensor 100 may output the image data Gi and the second-first phase detection data Li generated from the second-first phase detection pixel PD21 via the second channel VC1. The image data Gi may be generated from one normal pixel NPX20 among a plurality of normal pixels NPX11 to NPX24 where the color filter Gb belonging to the same unit group UG3 as the color filter Gb disposed on the second-first phase detection pixel PD21 is disposed. The image sensor 100 may output the second-second phase detection data Ri generated from the second-second phase detection pixel PD22 and the image data Ci via the second channel VC1. The image data Ci may be generated from one normal pixel NPX28 among a plurality of normal pixels NPX21 to NPX34 where the color filter B belonging to the same unit group UG4 as the color filter B disposed on the second-second phase detection pixel PD22 is disposed.

In that case, the image data Gi output together with the first-first phase detection data Li may be identical to the image data Gi output together with the second-first phase detection data Li. Furthermore, the image data Ci output together with the first-second phase detection data Ri may be identical to the image data Ci output together with the second-second phase detection data Ri.

Referring to FIG. 17, in an embodiment, the image sensor 100 may output the average image data Gi and the first-first phase detection data Li generated from the first-first phase detection pixel PD11 via the second channel VC1. The average image data Gi may be an average of a plurality of image data generated from each of the plurality of normal pixels NPX11 to NPX24 where the color filter Gb belonging to the same unit group UG3 as the color filter Gb disposed on the first-first phase detection pixel PD11 is disposed. The image sensor 100 may output the first-second phase detection data Ri generated from the first-second phase detection pixel PD12 and the average image data Ci, via the second channel VC1. The average image data Ci may be an average of a plurality of image data generated from each of the plurality of normal pixels NPX21 to NPX34 where the color filter B belonging to the same unit group UG4 as the color filter B disposed on the first-second phase detection pixel PD12 is disposed. The image sensor 100 may output the average image data Gi and the second-first phase detection data Li generated from the second-first phase detection pixel PD21, via the second channel VC1. The image sensor 100 may output the second-second phase detection data Ri generated from the second-second phase detection pixel PD22 and the average image data Ci, via the second channel VC1. The average image data Ci may be an average of a plurality of image data generated from each of the plurality of normal pixels NPX21 to NPX34 where the color filter B belonging to the same unit group UG4 as the color filter B disposed on the second-second phase detection pixel PD22 is disposed.

The average image data Gi output together with the first-first phase detection data Li generated from the first-first phase detection pixel PD11 may be identical to the average image data Gi output together with the second-first phase detection data Li generated from the second-first phase detection pixel PD21. The average image data Ci output together with the second-first phase detection data Ri generated from the second-first phase detection pixel PD21 may be identical to the average image data Ci output together with the second-second phase detection data Ri generated from the second-second phase detection pixel PD22.

Figure 18:
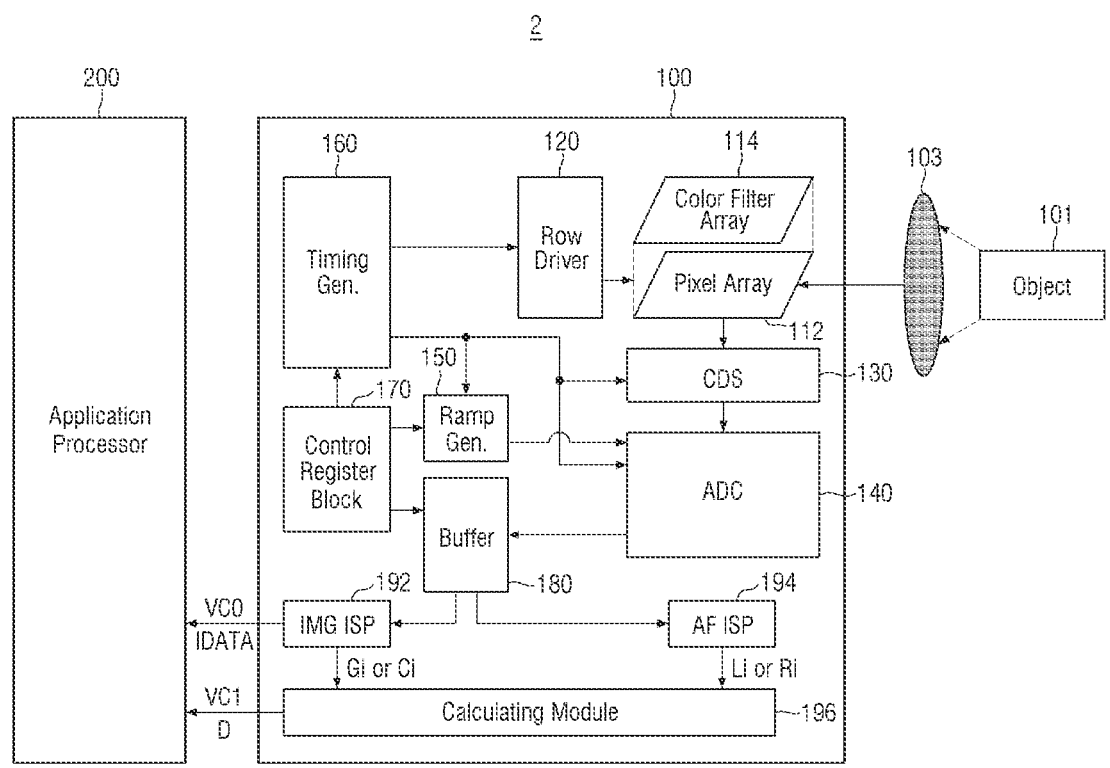
FIG. 18 is a block diagram illustrating an image sensing device according to an embodiment.

FIG. 18 is a block diagram illustrating an image sensing device according to an embodiment. For convenience of description, in which follows, differences from the descriptions using FIGS. 1 to 17 will be mainly described.

Referring to FIG. 18, an image sensing device 2 according to an embodiment may include an image sensor 100 and an application processor 200. The image sensor 100 may further include a calculating module 196. The calculating module 196 may be implemented with, for example, software, firmware, or hardware executed on the image sensor 100.

The calculating module 196 may operate in the same manner as the calculating module 210 described with reference to FIGS. 1 to 16. That is, in some embodiments, the image sensor 100 may calculate the disparity D using the phase detection data Li and Ri and the image data Gi and Ci.

The application processor 200 may receive the image data IDATA output by the first image signal processor 192 via the first channel VC0. The application processor 200 may receive the disparity D calculated by the calculating module 196 via the second channel VC1. The application processor may perform the auto-focusing based on the disparity D.

Figure 19:
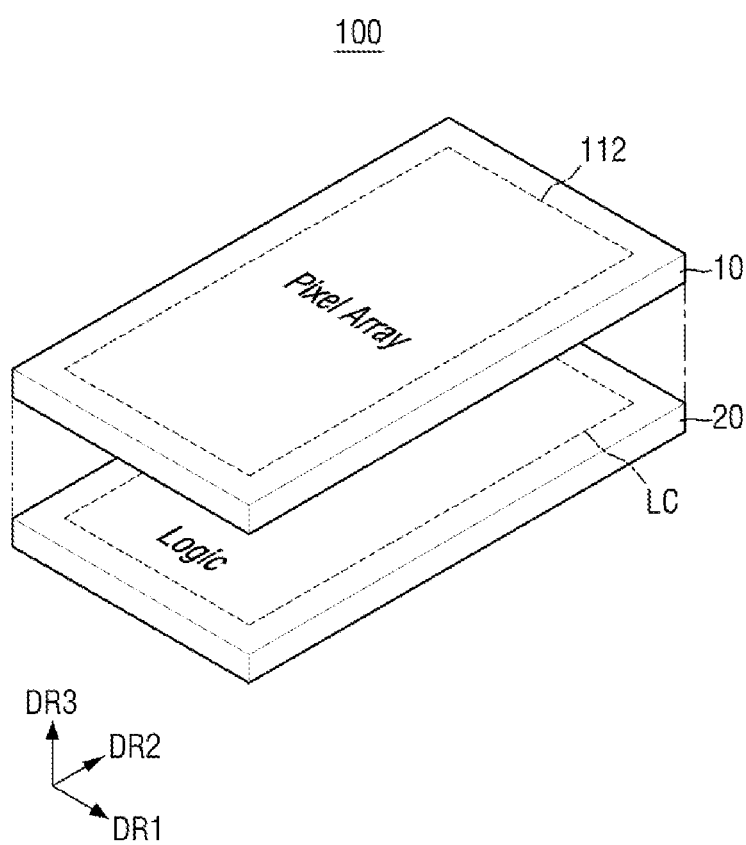
FIG. 19 is a block diagram illustrating an image sensor according to an embodiment.

FIG. 19 is a block diagram illustrating the image sensing device according to some embodiments.

Referring to FIG. 19, the image sensor 100 according to an embodiments may include a stacked first chip 10 and a stacked second chip 20. The second chip 20 may be stacked on, for example, the first chip 10 in a third direction DR3. The first chip 10 and the second chip 20 may be electrically connected to each other. A pixel signal (data) transmitted from the first chip 10 may be transmitted to a logic area LC.

The first chip 10 may include the pixel array 112 (see FIG. 1). The second chip 20 may include the logic area LC and a memory area. The logic circuit area LC may include a plurality of elements for driving pixel signal (data). The logic circuit area LC may include, for example, the row driver 120, the CDS block 140, the ramp signal generator 150, the timing generator 160, the control register block 170, the buffer 180, the first image signal processor 192 and the second image signal processor 194.

Figure 20:
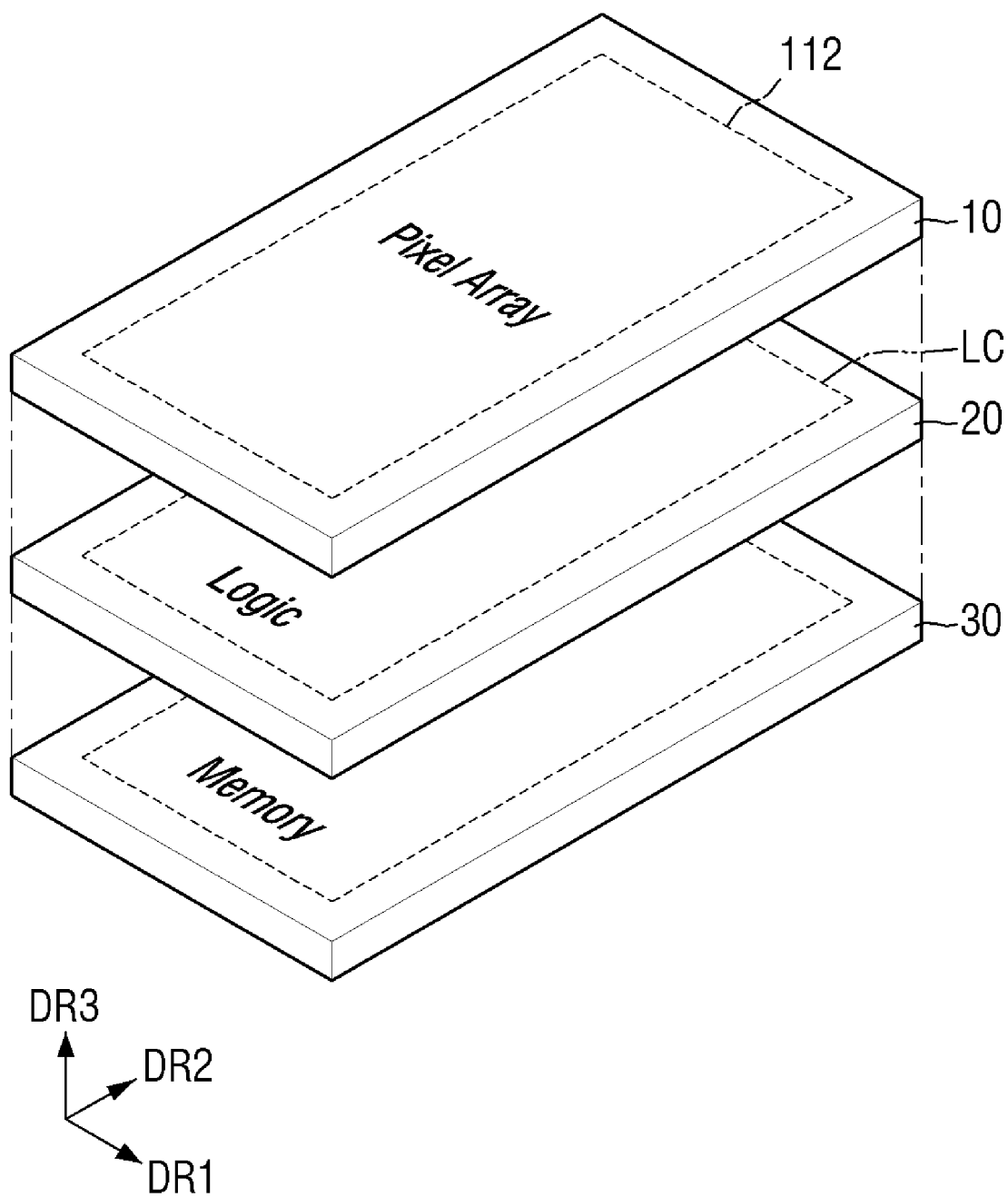
FIG. 20 is a block diagram illustrating the image sensor according to an embodiment.

FIG. 20 is a block diagram illustrating an image sensor according to an embodiments. For convenience of explanation, in which follows, the difference from the description using FIG. 19 will be mainly described.

Referring to FIG. 20, an image sensor 100' may further include a third chip 30. The third chip 30, the second chip 20, and the first chip 10 may be sequentially stacked in the third direction DR3. The third chip 30 may include a memory device. For example, the third chip 30 may include a volatile memory device such as DRAM and SRAM. The third chip 30 may receive a signal from the first chip 10 and the second chip 20 and process the signal through the memory device.

Figure 21:
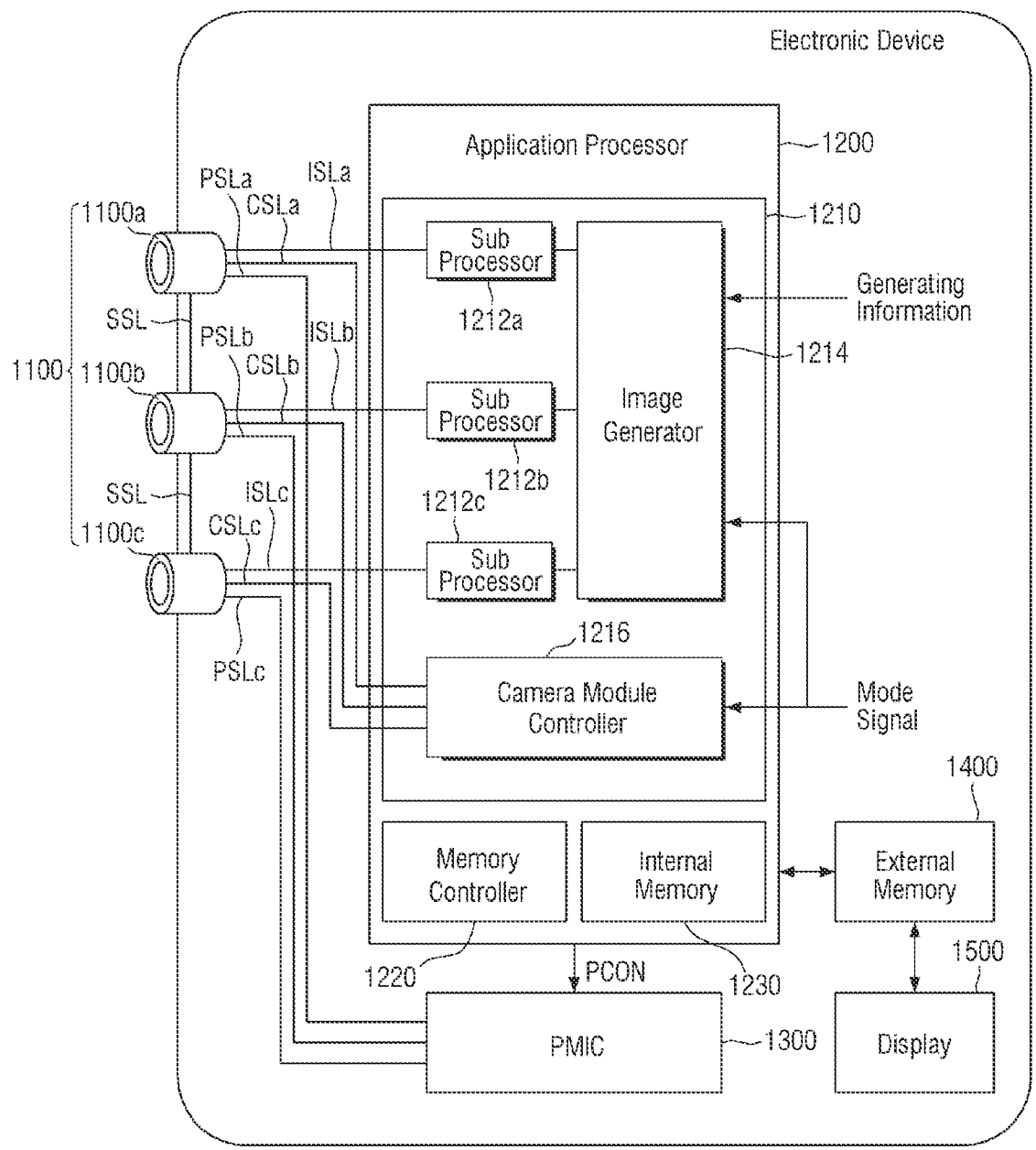
FIG. 21 is a block diagram of an electronic device including a multi-camera module.
Figure 22:
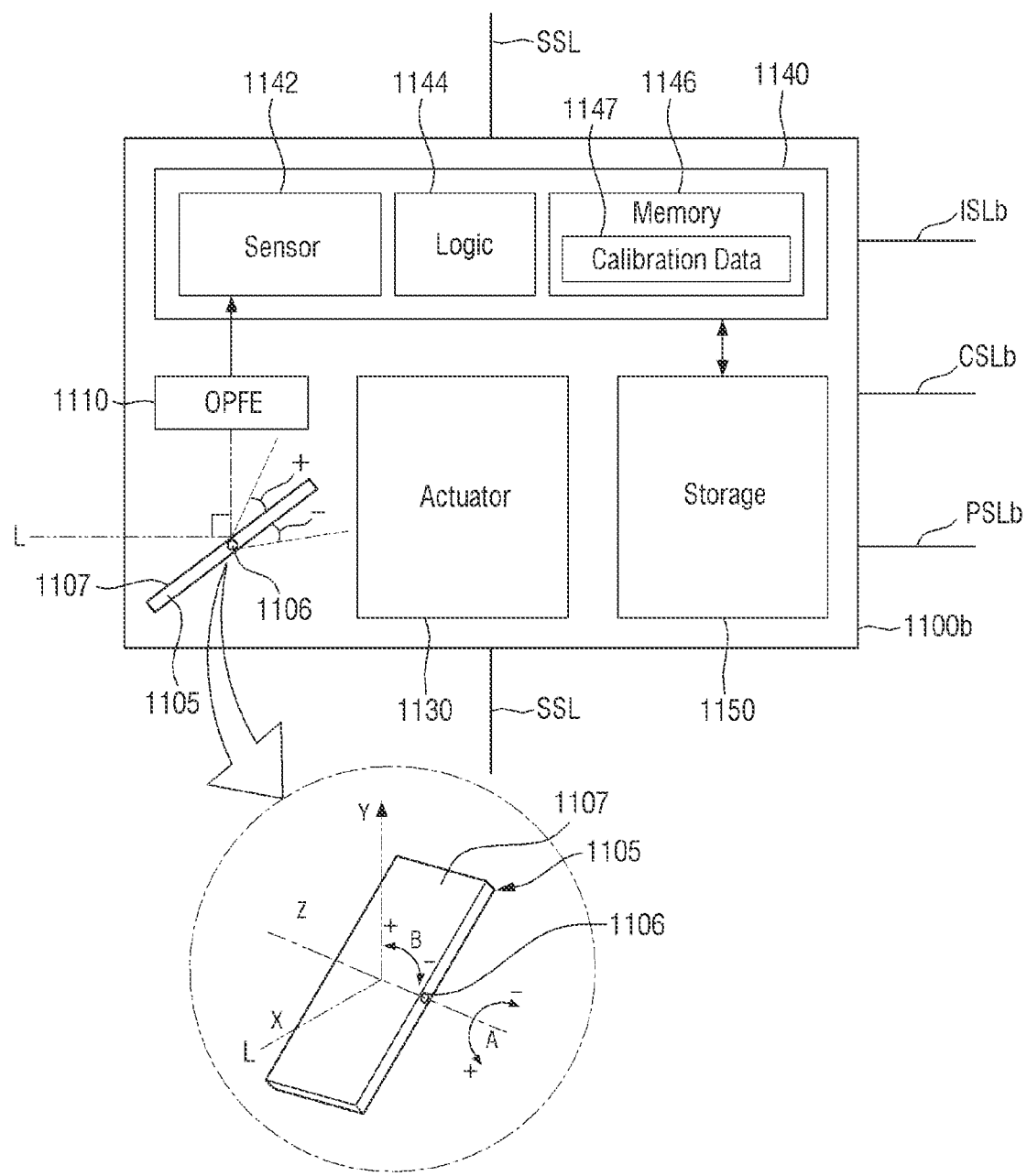
FIG. 22 is a detailed block diagram of the camera module in FIG. 21.

FIG. 21 is a block diagram of an electronic device including a multi-camera module. FIG. 22 is a detailed block diagram of the camera module in FIG. 21.

Referring to FIG. 21, an electronic device 1000 may include a camera module group 1100, an application processor 1200, a PMIC 1300 and an external memory 1400.

The camera module group 1100 may include a plurality of camera modules 1100a, 1100b and 1100c. Although the drawing illustrates an embodiment where three camera modules 1100a, 1100b and 1100c are arranged, the embodiments are not limited thereto. In some embodiments, the camera module group 1100 may be modified and implemented to include only two camera modules. In addition, in some embodiments, the camera module group 1100 may be modified and implemented to include n camera modules (where n is a natural number greater than 4).

Hereinafter, a detailed configuration of a camera module 1100b will be described in more detail with reference to FIG. 22. However, the following description may be equally applied to the other camera modules 1100a and 1100c according to one embodiment.

Referring to FIG. 22, the camera module 1100b may include a prism 1105, an optical path folding element (hereinafter referred to as "OPFE") 1110, an actuator 1130, an image sensing device 1140 and a storage 1150.

The prism 1105 may include a reflective surface 1107 of a light reflecting material to modify a path of light L incident from the outside.

In some embodiments, the prism 1105 may change the path of the light L incident in a first direction X to a second direction Y perpendicular to the first direction X. In addition, the prism 1105 may change the path of the light L incident in the first direction X to the second direction Y perpendicular to the first direction X by rotating the reflective surface 1107 of the light reflecting material in a direction A around a central axis 1106 or rotating the reflective surface 1107 of the light reflecting material in a direction B around the central axis 1106. In that case, the OPFE 1110 may also move in a third direction Z perpendicular to the first direction X and the second direction Y.

In some embodiments, as illustrated, a maximum rotation angle of the prism 1105 in the direction A may be 15 degrees or less in a positive (+) direction A and may be greater than 15 degrees in a negative (−) direction A, but the embodiments are not limited thereto.

In some embodiments, the prism 1105 may move at approximately 20 degrees, or between 10 and 20 degrees, or between 15 and 20 degrees, in a positive (+) or negative (−) direction B, where the prism 1105 may move at a moving angle which is the same angle in the positive (+) or negative (−) direction B or which is an almost similar angle in the range of about 1 degree.

In some embodiments, the prism 1105 may move a reflective surface 1107 of the light reflecting material in the third direction (e.g., the direction Z) parallel to the extending direction of the central axis 1106.

The OPFE 1110 may include, for example, an optical lens consisting of m groups (where m is a natural number). The m lenses may move in the second direction Y and change an optical zoom ratio of the camera module 1100b. For example, in the case where a basic optical zoom ratio of the camera module 1100b is Z, when m optical lenses included in the OPFE 1110 are moved, the optical zoom ratio of the camera module 1100b may be changed to an optical zoom ratio of 3Z, 5Z, or 5Z or more.

The actuator 1130 may move the OPFE 1110 or the optical lens (hereinafter referred to as "an optical lens") to a certain location. For example, the actuator 1130 may adjust the location of the optical lens such that an image sensor 1142 is located at a focal length of the optical lens for accurate sensing.

The image sensing device 1140 may include the image sensor 1142, a control logic 1144 and a memory 1146. The image sensor 1142 may sense an image of a sensing object using the light L provided via the optical lens. The control logic 1144 may control an overall operation of the camera module 1100b. For example, the control logic 1144 may control the operation of the camera module 1100b according to the control signal provided via a control signal line CSLb.

The memory 1146 may store information necessary for the operation of the camera module 1100b, such as calibration data 1147. The calibration data 1147 may include information necessary for the camera module 1100b to generate image data using the light L provided from the outside. The calibration data 1147 may include, for example, information on a degree of rotation, a focal length, an optical axis, as described above. When the camera module 1100b is implemented in the form of a multi-state camera where the focal length changes according to the location of the optical lens, the calibration data 1147 may include a focal length value for each location (or each state) of the optical lens and information associated with the auto-focusing.

The storage 1150 may store the image data sensed via the image sensor 1142. The storage 1150 may be disposed outside the image sensing device 1140 and implemented such that it is stacked with a sensor chip constituting the image sensing device 1140. In some embodiments, the storage 1150 may be implemented as an electrically erasable programmable read-only memory (EEPROM), but the embodiments are not limited thereto.

Referring to FIGS. 21 and 22 together, in some embodiments, each of the plurality of camera modules 1100a, 1100b and 1100c may include the actuator 1130. Accordingly, each of the plurality of camera modules 1100a, 1100b, and 1100c may include the calibration data 1147 identical to or different from each other according to the operation of the actuator 1130 included therein.

In some embodiments, one camera module (e.g., 1100b) among the plurality of camera modules 1100a, 1100b and 1100c may be a camera module in the form of a folded lens including the prism 1105 and the OPFE 1110 described above, while the remaining camera modules (e.g., 1100a and 1100c) may be vertical camera modules that fail to include the prism 1105 and the OPFE 1110, but the embodiments are not limited thereto.

In some embodiments, one camera module (e.g., 1100c) among the plurality of camera modules 1100a, 1100b and 1100c may be, for example, a vertical type of depth camera that extracts depth information using an infrared ray IR. In that case, the application processor 1200 may merge image data provided from the depth camera with image data provided from another camera module (e.g., 1100a or 1100b), thereby generating a 3D depth image.

In some embodiments, at least two camera modules (e.g., 1100a and 1100b) among the plurality of camera modules 1100a, 1100b and 1100c may have different field of views. In that case, for example, the optical lenses of at least two camera modules (e.g., 1100a and 1100b) among the plurality of camera modules 1100a, 1100b and 1100c may be different from each other, but the present disclosure is not limited thereto.

Furthermore, in some embodiments, field of views of each of the plurality of camera modules 1100a, 1100b and 1100c may differ from each other. In that case, the optical lenses included in each of the plurality of camera modules 1100a, 1100b and 1100c may also differ from each other, but the present invention is not limited thereto.

In some embodiments, each of the plurality of camera modules 1100a, 1100b and 1100c may be physically separated from each other. In other words, instead of dividing and using a sensing area of one image sensor 1142 by the plurality of camera modules 1100a, 1100b and 1100c, an independent image sensor 1142 may be disposed inside each of the plurality of camera modules 1100a, 1100b and 1100c.

Referring back to FIG. 21, the application processor 1200 may include an image processing device 1210, a memory controller 1220 and an internal memory 1230. The application processor 1200 may be implemented separately from the plurality of camera modules 1100a, 1100b and 1100c. For example, the application processor 1200 and the plurality of camera modules 1100a, 1100b and 1100c may be separately implemented with separate semiconductor chips.

The image processing apparatus 1210 may include a plurality of sub-image processors 1212a, 1212b and 1212c, an image generator 1214 and a camera module controller 1216.

The image processing apparatus 1210 may include a plurality of sub-image processors 1212a, 1212b and 1212c corresponding to the number of the plurality of camera modules 1100a, 1100b and 1100c.

The image data generated from each of the camera modules 1100a, 1100b and 1100c may be provided to the corresponding sub-image processors 1212a, 1212b and 1212c via image signal lines ISLa, ISLb and ISLc separated from each other. For example, the image data generated from the camera module 1100a may be provided to the sub-image processor 1212a via the image signal line ISLa, the image data generated from the camera module 1100b may be provided to the sub-image processor 1212b via the image signal line ISLb, and the image data generated from the camera module 1100c may be provided to the sub-image processor 1212c via the image signal line ISLc. The image data transmission may be performed using, for example, a camera serial interface (CSI) based on a mobile industry processor interface (MIPI), but the embodiments are not limited thereto.

Meanwhile, in some embodiments, one sub-image processor may be disposed to correspond to the plurality of camera modules. For example, the sub-image processor 1212a and the sub-image processor 1212c are not implemented separately from each other as illustrated in the drawing, but may be integrated into one sub-image processor, and the image data provided from the camera module 1100a and the camera module 1100c may be selected through a selection element (e.g., a multiplexer) and then provided to the integrated sub-image processor.

The image data provided to each of the sub-image processors 1212a, 1212b and 1212c may be provided to the image generator 1214. The image generator 1214 may generate an output image using the image data provided from each of the sub-image processors 1212a, 1212b and 1212c according to image generating information or a mode signal.

Specifically, the image generator 1214 may generate the output image by merging at least part of the image data generated from camera modules 1100a, 1100b and 1100c having different field of views according to the image generating information or the mode signal. Furthermore, the image generator 1214 may generate the output image by selecting one of the image data generated from the camera modules 1100a, 1100b and 1100c having different field of views according to the image generating information or the mode signal.

In some embodiments, the image generating information may include a zoom signal or a zoom factor. Furthermore, in some embodiments, the mode signal may be, for example, a signal based on a mode selected from a user.

When the image generating information is the zoom signal (zoom factor) and each of the camera modules 1100a, 1100b and 1100c has different field of views, the image generator 1214 may perform different operations according to the type of zoom signals. For example, when the zoom signal is a first signal, after merging the image data output from the camera module 1100a and the image data output from the camera module 1100c, the output image may be generated by using the merged image signal and the image data output from the camera module 1100b not used for the merging. When the zoom signal is a second signal different from the first signal, the image generator 1214 may generate the output image by selecting one of the image data output from each of the camera modules 1100a, 1100b and 1100c without conducting such image data merging. However, the embodiments are not limited thereto, and a method of processing the image data may be modified and implemented as necessary.

In some embodiments, the image generator 1214 may receive a plurality of image data with different exposure times from at least one of the plurality of sub-image processors 1212a, 1212b and 1212c and perform high dynamic range (HDR) processing on the plurality of image data, thereby generating merged image data with an increased dynamic range.

The camera module controller 1216 may provide control signals to each of the camera modules 1100a, 1100b and 1100c. The control signal generated from the camera module controller 1216 may be provided to the corresponding camera modules 1100a, 1100b and 1100c via the control signal lines CSLa, CSLb and CSLc separated from each other.

One of the plurality of camera modules 1100a, 1100b and 1100c may be designated as a master camera (e.g., 1100b) according to the image generating information including the zoom signal or the mode signal, while the remaining camera modules (e.g., 1100a and 1100c) may be designated as slave cameras. The information may be included in the control signal and provided to the corresponding camera modules 1100a, 1100b and 1100c via the control signal lines CSLa, CSLb and CSLc separated from each other.

The camera module operating as the master and slave cameras may be changed according to the zoom factor or the operation mode signal. For example, when the field of view of the camera module 1100a is wider than the field of view of the camera module 1100b and the zoom factor exhibits a low zoom ratio, the camera module 1100b may operate as the master camera and the camera module 1100a may operate as the slave camera. Conversely, when the zoom factor exhibits a high zoom ratio, the camera module 1100a can operate as the master camera and the camera module 1100b can operate as the slave camera.

In some embodiments, the control signal provided from the camera module controller 1216 to each of the camera modules 1100a, 1100b and 1100c may include a sync enable signal. For example, when the camera module 1100b is the master camera and the camera modules 1100a and 1100c are the slave cameras, the camera module controller 1216 may transmit the sync enable signal to the camera module 1100b. The camera module 1100b that receives the sync enable signal may generate a sync signal based on the received sync enable signal and provide the generated sync signal to the camera modules 1100a and 1100c via a sink signal line SSL. The camera module 1100b and the camera modules 1100a and 1100c may be synchronized with the sync signal to transmit the image data to the application processor 1200.

In an embodiment, the control signal provided from the camera module controller 1216 to the plurality of camera modules 1100a, 1100b and 1100c may include mode information according to the mode signal. Based on the mode information, the plurality of camera modules 1100a, 1100b and 1100c may operate in a first operation mode and a second operation mode in association with a sensing speed.

In the first operation mode, the plurality of camera modules 1100a, 1100b and 1100c may generate an image signal (e.g., generate an image signal of a first frame rate) at a first speed, encode the image signal at a second speed that is higher than the first speed (e.g., encode an image signal of a second frame rate higher than the first frame rate), and transmit the encoded image signal to the application processor 1200. In that case, the second speed may be less than or equal to 30 times the first speed.

The application processor 1200 may store the received image signal, i.e., the encoded image signal, in the memory 1230 formed inside or the storage 1400 formed outside the application processor 1200, read and decode the encoded image signal from the memory 1230 or the storage 1400, and display the image data generated based on the decoded image signal. For example, a corresponding sub-processor among the plurality of sub-processors 1212a, 1212b and 1212c of the image processing apparatus 1210 may perform decoding and may also perform image processing on the decoded image signal.

In the second operation mode, the plurality of camera modules 1100a, 1100b and 1100c may generate an image signal at a third speed that is lower than the first speed (e.g., generate the image signal at a third frame rate lower than the first frame rate), and transmit the image signal to the application processor 1200. The image signal provided to the application processor 1200 may be an unencoded signal. The application processor 1200 may perform the image processing on the received image signal or store the image signal in the memory 1230 or the storage 1400.

The PMIC 1300 may provide power, for example, a power voltage, to each of a plurality of camera modules 1100a, 1100b and 1100c. For example, the PMIC 1300 may provide a first power to the camera module 1100a via a power signal line PSLa, a second power to the camera module 1100b via a power signal line PSLb, and a third power to the camera module 1100c via a power signal line PSLc under the control of the application processor 1200.

The PMIC 1300 may generate power corresponding to each of the plurality of camera modules 1100a, 1100b and 1100c in response to a power control signal PCON from the application processor 1200 and may also adjust a level of power. The power control signal PCON may include power adjustment signals for each operation mode of the plurality of camera modules 1100a, 1100b and 1100c. For example, the operation mode may include a low power mode, and in that case, the power control signal PCON may include information on a camera module that operates in the low power mode and a set level of power. Levels of power provided to each of the plurality of camera modules 1100a, 1100b and 1100c may be identical to or different from each other. Furthermore, the level of power may be dynamically changed.

Although embodiments of the present disclosure have been described above with reference to the accompanying drawings, the present disclosure is not limited to the disclosed embodiments, but may be implemented in various different ways, and the present disclosure may be embodied in many different forms as will be understood by those skilled in the art. Therefore, embodiments set forth herein are exemplary only and not to be construed as a limitation.

What is claimed is:

1. An image sensor, comprising:
a pixel array including a plurality of normal pixels and a plurality of phase detection groups, wherein each phase detection group includes a first phase detection pixel and a second phase detection pixel disposed adjacent to the first phase detection pixel; and
a color filter array including a plurality of unit groups, wherein each unit group includes a plurality of color filters of a same color arranged in an M×N matrix on the pixel array,
wherein a first color filter among the color filters of a first color is disposed on the first phase detection pixel of one of the unit groups and a second color filter among the color filters of a second color different from the first color is disposed on the second phase detection pixel of another one of the unit groups,
wherein M and N are natural numbers,
wherein a first side of the first phase detection pixel is adjacent a first one of the normal pixels with the first color filter in a first column,
wherein a second side of the first phase detection pixel opposing the first side is adjacent a second one of the normal pixels with the first color filter in the first column,
wherein a first side of the second phase detection pixel is adjacent a first one of the normal pixels with the second color filter in a second column, and
wherein a second side of the second phase detection pixel is adjacent a second one of the normal pixels with the second color filter in the second column.

2. The image sensor of claim 1, further comprising:
a plurality of first micro-lenses configured to cover each of the plurality of normal pixels, and a plurality of second micro-lenses configured to cover each of the plurality of phase detection groups, wherein the first phase detection pixel and the second phase detection pixel share a corresponding one of the plurality of second micro-lens.

3. The image sensor of claim 1, wherein each of the plurality of unit groups comprises:
a first unit group and a second unit group disposed adjacent to the first unit group in a first direction, and a third unit group and a fourth unit group disposed adjacent to the third unit group in the first direction,
wherein the first unit group and the third unit group are disposed adjacent to each other in a second direction intersecting the first direction,
the second unit group and the fourth unit group are disposed adjacent to each other in the second direction,
the first unit group includes a third color filter,
the second unit group and the third unit group include a fourth color filter, and
the fourth unit group includes a fifth color filter.

4. The image sensor of claim 1, further comprising an image signal processor that outputs first phase detection data generated from the first phase detection pixel and then second phase detection data generated from the second phase detection pixel via a channel.

5. The image sensor of claim 1, wherein the plurality of normal pixels include a plurality of first normal pixels and a plurality of second normal pixels, and the plurality of unit groups each comprises:
a first unit group including color filters disposed on the first phase detection pixel and the plurality of first normal pixels; and
a second unit group including color filters disposed on the second phase detection pixel and the plurality of second normal pixels, and
wherein the image sensor further comprises an image signal processor configured to, output first phase detection data generated from the first phase detection pixel and first image data generated from one of the plurality of first normal pixels together via a channel, and output second phase detection data generated from the second phase detection pixel and second image data generated from one of the plurality of second normal pixels together via the channel.

6. The image sensor of claim 1, wherein the plurality of normal pixels include a plurality of first normal pixels and a plurality of second normal pixels, and the plurality of unit groups each comprises:
a first unit group including color filters disposed on the first phase detection pixel and the plurality of first normal pixels; and
a second unit group including color filters disposed on the second phase detection pixel and the plurality of second normal pixels, and
wherein the image sensor further comprises an image signal processor configured to, output first phase detection data generated from the first phase detection pixel and an average of a plurality of first image data generated from the plurality of first normal pixels together via a channel, and output second phase detection data generated from the second phase detection pixel and an average of a plurality of second image data generated from the plurality of second normal pixels together via the channel.

7. An image sensor, comprising:
a pixel array including a plurality of normal pixels, and a plurality of phase detection pixel groups, wherein each phase detection pixel group includes a first phase detection pixel and a second phase detection pixel disposed adjacent to the first phase detection pixel; and
an image signal processor configured to output one of a plurality of phase detection data generated from the phase detection pixel groups and one of a plurality of image data generated from the plurality of normal pixels together via a channel,
wherein one of the phase detection pixel groups in a first row is adjacent two of the normal pixels in the first row with a first color filter of a first color and two of the normal pixels in the first row with a second color filter of a second other color,
wherein a first pixel of the one phase detection pixel group is located between two of the normal pixels in a first column with the first color filter and a second pixel of the one phase detection pixel group is located between two of the normal pixels in a second column with the second color filter.

8. The image sensor of claim 7, wherein the plurality of phase detection data includes first phase detection data generated from the first phase detection pixel and second phase detection data generated from the second phase detection pixel, and the image signal processor outputs the first phase detection data and then the second phase detection data via the channel.

9. The image sensor of claim 7, wherein the plurality of phase detection data includes first phase detection data generated from the first phase detection pixel and second phase detection data generated from the second phase detection pixel, the plurality of image data includes first image data generated from a first normal pixel among the normal pixels disposed adjacent to the first phase detection pixel and second image data generated from a second normal pixel among the normal pixels adjacent to the second phase detection pixel, and the image signal processor is configured to, output the first phase detection data and the first image data together via the channel, and output the second phase detection data and the second image data together via the channel.

10. The image sensor of claim 9, wherein a color filter disposed on the first phase detection pixel has a same color as a color filter disposed on the first normal pixel, and a color filter disposed on the second phase detection pixel has a same color as a color filter disposed on the second normal pixel.

11. The image sensor of claim 7, wherein the plurality of phase detection data includes first phase detection data generated from the first phase detection pixel and second phase detection data generated from the second phase detection pixel, and the plurality of image data includes a plurality of first image data generated from a plurality of first normal pixels among the normal pixels that share a color filter as the first phase detection pixel, and a plurality of second image data generated from a plurality of second normal pixels among the normal pixels that share a same color filter as the second phase detection pixel, wherein the image signal processor is configured to, output the first phase detection data and an average of the plurality of first image data together via the channel, and output the second phase detection data and an average of the plurality of second image data together via the channel.

* * * * *